US012757485B2

(12) United States Patent
Park et al.

(10) Patent No.: US 12,757,485 B2
(45) Date of Patent: Oct. 6, 2026

(54) 3D-STACKED SEMICONDUCTOR DEVICE INCLUDING MIDDLE ISOLATION STRUCTURE AND BSPDN STRUCTURE

(71) Applicant: SAMSUNG ELECTRONICS CO., LTD., Suwon-si (KR)

(72) Inventors: Keumseok Park, Slingerlands, NY (US); Seungchan Yun, Waterford, NY (US); Kang-Ill Seo, Springfield, VA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 364 days.

(21) Appl. No.: 18/521,323

(22) Filed: Nov. 28, 2023

(65) Prior Publication Data

US 2025/0040242 A1 Jan. 30, 2025

Related U.S. Application Data

(60) Provisional application No. 63/528,553, filed on Jul. 24, 2023.

(51) Int. Cl.

*H10D 84/85* (2025.01)
*H10D 30/01* (2025.01)

(Continued)

(52) U.S. Cl.

CPC ......... *H10D 84/856* (2025.01); *H10D 30/014* (2025.01); *H10D 30/43* (2025.01); *H10D 30/6729* (2025.01); *H10D 30/6735* (2025.01); *H10D 62/121* (2025.01); *H10D 62/151* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 88/01* (2025.01); *H10W 20/427* (2026.01)

(58) Field of Classification Search

None

See application file for complete search history.

(56) References Cited

U.S. PATENT DOCUMENTS

| | | | |
|---|---|---|---|
| 10,879,352 | B2 | 12/2020 | Zhang et al. |
| 11,164,792 | B2 | 11/2021 | Xie et al. |

(Continued)

*Primary Examiner* — Bo B Jang

(74) *Attorney, Agent, or Firm* — Myers Bigel, P.A.

(57) ABSTRACT

Provided is a semiconductor device which includes: a $1^{st}$ source/drain region connected to a $1^{st}$ channel structure which is controlled by a $1^{st}$ gate structure; a $2^{nd}$ source/drain region, above the $1^{st}$ source/drain region, connected to a $2^{nd}$ channel structure which is controlled by a $2^{nd}$ gate structure; and a middle isolation structure between the $1^{st}$ gate structure and the $2^{nd}$ gate structure, wherein the middle isolation structure comprises two or more vertically-stacked semiconductor layers.

20 Claims, 14 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |
| ***H10D 88/00*** | (2026.01) |
| ***H10W 20/41*** | (2026.01) |

(56) References Cited

U.S. PATENT DOCUMENTS

| | | | | |
|---|---|---|---|---|
| 11,177,258 | B2 | 11/2021 | Xie et al. | |
| 2020/0227570 | A1* | 7/2020 | Chen | B82Y 10/00 |
| 2021/0175327 | A1 | 6/2021 | Fulford et al. | |
| 2022/0216340 | A1* | 7/2022 | Lin | H10D 84/013 |
| 2023/0197778 | A1 | 6/2023 | Xie et al. | |
| 2023/0197815 | A1 | 6/2023 | Huang et al. | |

* cited by examiner

FIG. 5A

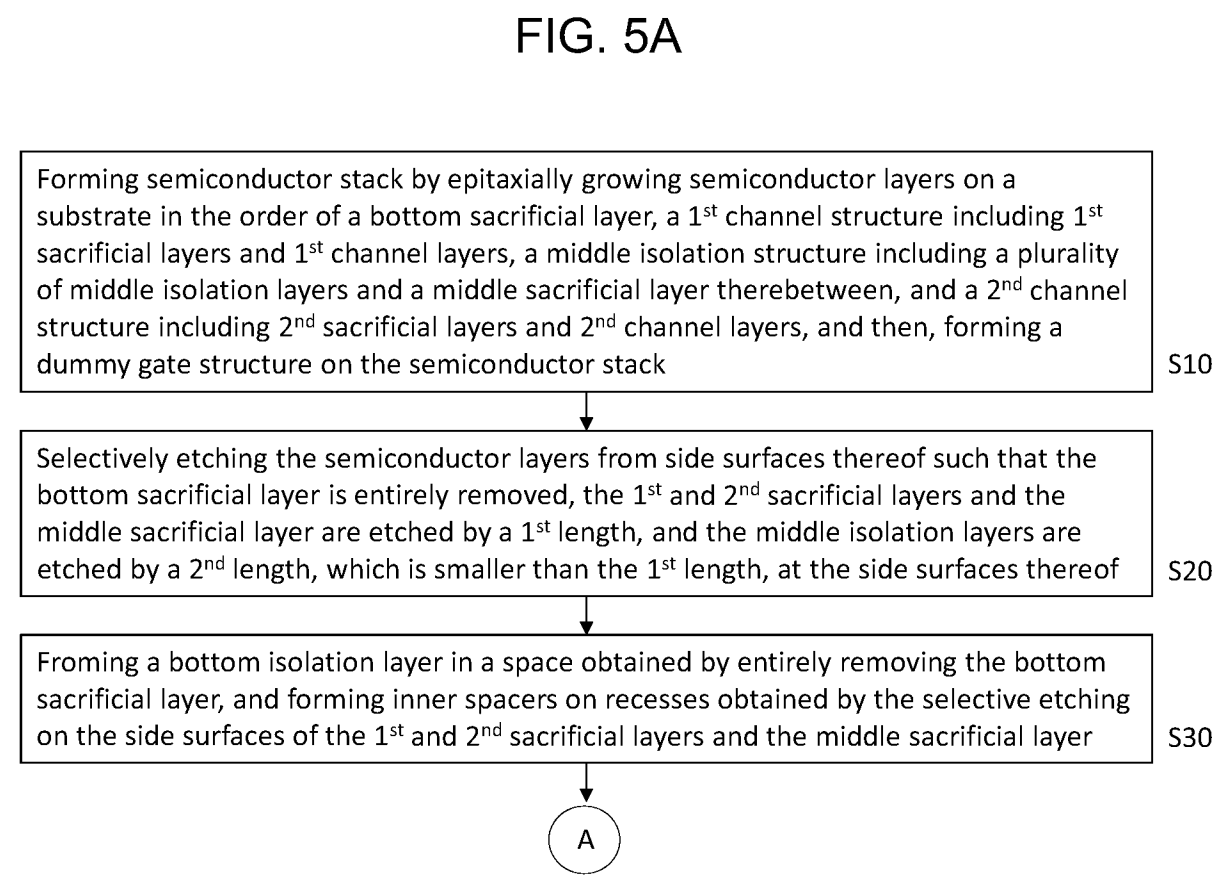

S10: Forming semiconductor stack by epitaxially growing semiconductor layers on a substrate in the order of a bottom sacrificial layer, a $1^{st}$ channel structure including $1^{st}$ sacrificial layers and $1^{st}$ channel layers, a middle isolation structure including a plurality of middle isolation layers and a middle sacrificial layer therebetween, and a $2^{nd}$ channel structure including $2^{nd}$ sacrificial layers and $2^{nd}$ channel layers, and then, forming a dummy gate structure on the semiconductor stack

↓

S20: Selectively etching the semiconductor layers from side surfaces thereof such that the bottom sacrificial layer is entirely removed, the $1^{st}$ and $2^{nd}$ sacrificial layers and the middle sacrificial layer are etched by a $1^{st}$ length, and the middle isolation layers are etched by a $2^{nd}$ length, which is smaller than the $1^{st}$ length, at the side surfaces thereof

↓

S30: Froming a bottom isolation layer in a space obtained by entirely removing the bottom sacrificial layer, and forming inner spacers on recesses obtained by the selective etching on the side surfaces of the $1^{st}$ and $2^{nd}$ sacrificial layers and the middle sacrificial layer

↓

A

3D-STACKED SEMICONDUCTOR DEVICE INCLUDING MIDDLE ISOLATION STRUCTURE AND BSPDN STRUCTURE

CROSS-REFERENCE TO RELATED APPLICATION

This application is based on and claims priority from U.S. Provisional Application No. 63/528,553 filed on Jul. 24, 2023 in the U.S. Patent and Trademark Office, the disclosure of which is incorporated herein in its entirety by reference.

BACKGROUND

1. Field

Apparatuses and methods related to the disclosure relate to a three-dimensionally-stacked (3D-stacked) or multi-stack semiconductor device in which a $1^{st}$ transistor is isolated from a $2^{nd}$ transistor disposed above the $1^{st}$ transistor through a strengthened isolation structure.

2. Description of the Related Art

A 3D-stacked semiconductor device including a $1^{st}$ transistor and a $2^{nd}$ transistor disposed above the $1^{st}$ transistor has been introduced in response to increased demand for an integrated circuit having a high device density and performance. Each of the two transistors may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure and a gate structure surrounding all four surfaces of each of the nanosheet channel layers. The nanosheet transistor is referred to as gate-all-around (GAA) transistor, or as a multi-bridge channel field-effect transistor (MBCFET).

However, there exists a risk of a short circuit between the two transistors in the 3D-stacked semiconductor device, for example, between the gate structures of the two transistors at least because of the nanometer scale of the 3D-stacked semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a semiconductor device including a $1^{st}$ transistor and a $2^{nd}$ transistor stacked thereon, in which the gate structures of the two transistors may be vertically isolated from each other through one or more semiconductor layers having a sufficient thickness for improved isolation between the gate structures of the two transistors.

According to an embodiment, there is provided a 3D-stacked semiconductor device which may include: a $1^{st}$ source/drain region connected to a $1^{st}$ channel structure which is controlled by a $1^{st}$ gate structure; a $2^{nd}$ source/drain region, above the $1^{st}$ source/drain region, connected to a $2^{nd}$ channel structure which is controlled by a $2^{nd}$ gate structure; and a middle isolation structure between the $1^{st}$ gate structure and the $2^{nd}$ gate structure, wherein the middle isolation structure comprises two or more vertically-stacked semiconductor layers.

According to embodiments, the semiconductor layers may be formed of silicon germanium (SiGe), and at least one of a portion of the $1^{st}$ gate structure and a portion of the $2^{nd}$ gate structure may be disposed between the semiconductor layers. The at least one of the portion of the $1^{st}$ gate structure and the portion of the $2^{nd}$ gate structure may not be connected to a remaining portion of the $1^{st}$ gate structure or a remaining portion of the $2^{nd}$ gate structure.

According to an embodiment, the 3D-stacked semiconductor device may further include: at least one inner spacer between the $1^{st}$ source/drain region and the $1^{st}$ gate structure, and at least one inner spacer between the $2^{nd}$ source/drain region and the $2^{nd}$ gate structure; and an additional inner spacer, on a side surface of the middle isolation structure, which is connected to the at least one inner spacer According to an embodiment, the 3D-stacked semiconductor device may further include: a backside contact structure connected to a bottom surface of the $1^{st}$ source/drain region; and a bottom isolation layer below a bottom surface of the $1^{st}$ gate structure.

According to an embodiment, there is provided a 3D-stacked semiconductor device which may include: $1^{st}$ source/drain regions connected to a $1^{st}$ channel structure surrounded by a $1^{st}$ gate structure; $2^{nd}$ source/drain regions, respectively above the $1^{st}$ source/drain regions, connected to a $2^{nd}$ channel structure which is surrounded by a $2^{nd}$ gate structure; and a middle isolation structure between the $1^{st}$ gate structure and the $2^{nd}$ gate structure, wherein the middle isolation structure includes at least one layer comprising silicon germanium (SiGe) with Ge concentration of 10-15%.

According to an embodiment, the at least one layer may include two or more SiGe layers with Ge concentration of 10-15%.

According to an embodiment, there is provided a 3D-stacked semiconductor device which may include: a $1^{st}$ source/drain region connected to a $1^{st}$ channel structure surrounded by a $1^{st}$ gate structure; a $2^{nd}$ source/drain region, above the $1^{st}$ source/drain region, connected to a $2^{nd}$ channel structure which is surrounded by a $2^{nd}$ gate structure; and a middle isolation structure between the $1^{st}$ gate structure and the $2^{nd}$ gate structure, wherein the middle isolation structure includes at least one of a portion of the $1^{st}$ gate structure and a portion of the $2^{nd}$ gate structure.

According to an embodiment, the middle isolation structure may further include two or more semiconductor layers which are vertically stacked, and the at least one of a portion of the $1^{st}$ gate structure and a portion of the $2^{nd}$ gate structure may be disposed between the semiconductor layers. Further, the at least one of the portion of the $1^{st}$ gate structure and the portion of the $2^{nd}$ gate structure is not connected to a remaining portion of the $1^{st}$ gate structure or a remaining portion of the $2^{nd}$ gate structure.

According to embodiments, there is provided a method of manufacturing a 3D-stacked semiconductor device. The method may include: (i) stacking a $1^{st}$ channel structure, a middle isolation structure, and a $2^{nd}$ channel structure on a substrate in this order, wherein the $1^{st}$ channel structure includes $1^{st}$ sacrificial layers and $1^{st}$ channel layers, the middle isolation structure includes a plurality of middle isolation layers with a middle sacrificial layer therebetween, and the $2^{nd}$ channel structure includes $2^{nd}$ sacrificial layers and $2^{nd}$ channel layers; (ii) etching side surfaces of the $1^{st}$ sacrificial layers, the $2^{nd}$ sacrificial layers, the middle sacrificial layer, and the middle isolation layers; (iii) forming inner spacers on the etched side surfaces of the $1^{st}$ sacrificial layers, the $2^{nd}$ sacrificial layers, the middle sacrificial layer, and the middle isolation layers; (iv) forming $1^{st}$ source/drain regions based on the $1^{st}$ channel layers, and forming $2^{nd}$ source/drain regions based on the $2^{nd}$ channel layers; and (v) replacing the $1^{st}$ sacrificial layers with a $1^{st}$ gate structure, and replacing the $2^{nd}$ sacrificial layers with a $2^{nd}$ gate structure, wherein the middle sacrificial layer is replaced with a portion of at least one of the $1^{st}$ gate structure, the $2^{nd}$ gate structure, and a dielectric material.

BRIEF DESCRIPTION OF DRAWINGS

Example embodiments of the disclosure will be more clearly understood from the following detailed description taken in conjunction with the accompanying drawings in which:

FIGS. 5A and 5B illustrate a flowchart of manufacturing a BSPDN-based 3D-stacked semiconductor device shown in FIGS. 3 to 4A-4N, according embodiments.

DETAILED DESCRIPTION

Figure 1A:
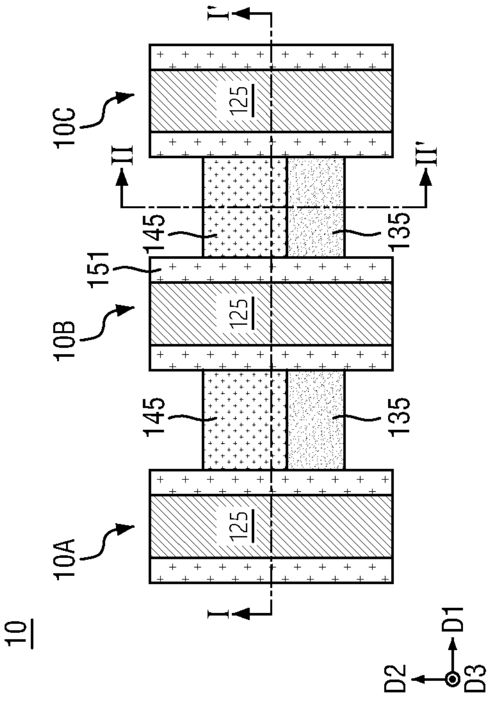
FIG. 1A illustrates a schematic top plan view of a 3D-stacked semiconductor device including a middle isolation structure.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. Herein, the term “isolation” pertains to electrical insulation or separation between structures, layers, components or regions in a corresponding device or structure.

Figure 1B:
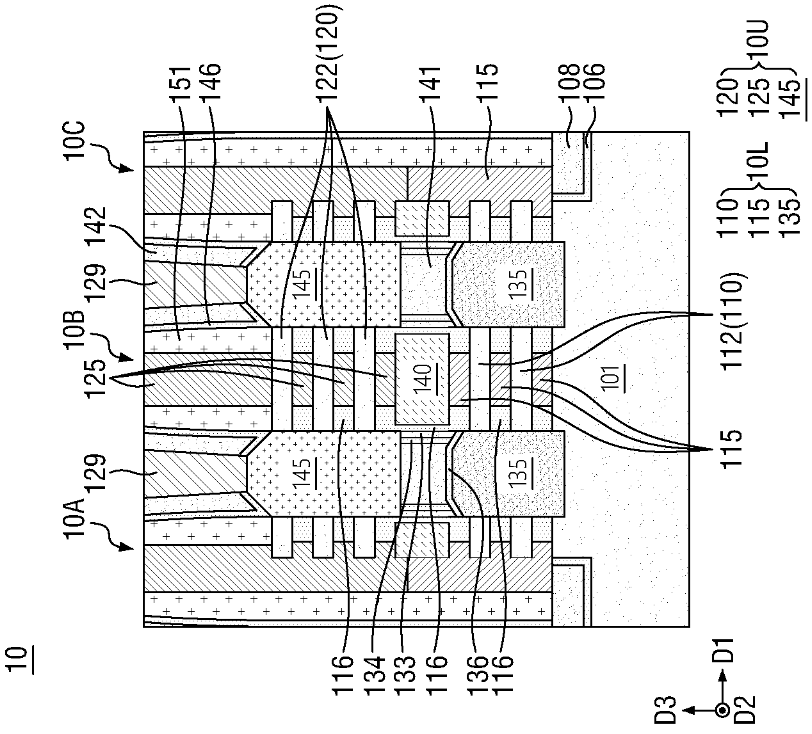
FIGS. 1B and 1C illustrate cross-section views of the 3D-stacked semiconductor device of FIG. 1A along lines I-I' and II-II' shown therein in a D1 direction and a D2 direction, respectively.
Figure 1C:
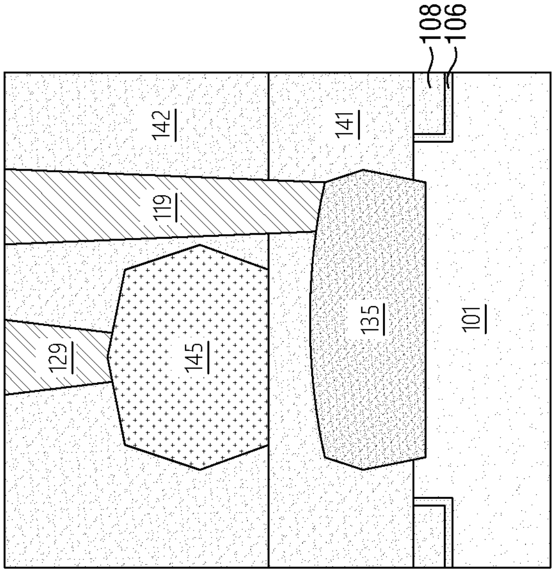

FIG. 1A illustrates a schematic top plan view of a 3D-stacked semiconductor device including a middle isolation structure, and FIGS. 1B and 1C illustrate cross-section views of the 3D-stacked semiconductor device of FIG. 1A along lines I-I' and II-II' shown therein in a D1 direction and a D2 direction, respectively.

It is to be understood here that FIG. 1A shows only a positional relationship between a plurality of gate structures and source/drain regions, and thus, some structural elements such as isolation layers and contact plugs shown in FIGS. 1B and 1C may not be shown in FIG. 1A. The D1 direction is a channel-length direction which is a direction of current flow between two source/drain regions connected to each other through a channel structure, and the D2 direction is a channel-width direction that intersects the D1 direction. A D3 direction is a channel-thickness direction that intersects the D1 and D2 directions.

Referring to FIGS. 1A-1C, a 3D-stacked semiconductor device 10 may include a $1^{st}$ semiconductor stack 10A, a $2^{nd}$ semiconductor stack 10B, and a $3^{rd}$ semiconductor stack 10C on a substrate 101. The substrate 101 may be a silicon (Si) substrate, and additionally or alternatively, it may include other materials such as silicon germanium (SiGe), silicon carbide (SiC), not being limited thereto.

Each of the semiconductor stacks 10A-10C may include a $1^{st}$ channel structure 110 surrounded by a $1^{st}$ gate structure 115 and a $2^{nd}$ channel structure 120 formed above the $1^{st}$ channel structure 110 and surrounded by a $2^{nd}$ gate structure 125. The $1^{st}$ channel structure 110 may include a plurality of $1^{st}$ channel layers 112, and the $2^{nd}$ channel structure 120 may include a plurality of $2^{nd}$ channel layers 122. These channel layers may each be a thin nanosheet, nanowire or nanoribbon, and thus, the $1^{st}$ transistor 10L and the $2^{nd}$ transistor 10U may each be referred to as a nanosheet transistor. The channel layers 112 and 122 may each be formed of the same material, for example, silicon (Si) included in the substrate 101. Here, the $1^{st}$ and $2^{nd}$ channel structures included in each of the $1^{st}$ and $3^{rd}$ semiconductor stacks 10A and 10C may be used to form source/drain regions as described later, but may not function as a channel of a transistor in some instances. Thus, the $1^{st}$ and $3^{rd}$ semiconductor stacks 10A and 10C may each be a dummy transistor structure, and may be removed in the 3D-stacked semiconductor device 10 in its completed form. In other instances (not shown for simplicity), the $1^{st}$ and $3^{rd}$ semiconductor stacks 10A and 10C may be configured to be active regions of additional transistors, connecting even more source/drain regions.

$1^{st}$ source/drain regions 135 and $2^{nd}$ source/drain regions 145 may be formed between the $1^{st}$ semiconductor stack 10A and the $2^{nd}$ semiconductor stack 10B, and between the $2^{nd}$ semiconductor stack 10B and the $3^{rd}$ semiconductor stack 10C. The $1^{st}$ source/drain regions 135 may be connected to each other through the $1^{st}$ channel structure 110 surrounded by the $1^{st}$ gate structure 115 in the $2^{nd}$ semiconductor stack 10B, to form a $1^{st}$ transistor 10L (e.g., a “lower transistor”). The $2^{nd}$ source/drain regions 145 may be connected to each other through the $2^{nd}$ channel structure 120 surrounded by the $2^{nd}$ gate structure 125 in the $2^{nd}$ semiconductor stack 10B, to form a $2^{nd}$ transistor 10U (e.g., an “upper transistor”).

The $1^{st}$ source/drain regions 135 may be formed of silicon (Si) doped with n-type impurities such as phosphorus (P), arsenic (As), antimony (Sb), etc. to form the $1^{st}$ transistor 10L as an n-type transistor. The $2^{nd}$ source/drain regions 145 may be formed of Si or SiGe doped with p-type impurities such as boron (B), gallium (Ga), indium (In), etc., to form the $2^{nd}$ transistor 10U as a p-type transistor. The disclosure is not limited thereto, however, and the $1^{st}$ transistor 10L may be formed as a p-type and the $2^{nd}$ transistor 10U may be formed as an n-type, or both of the $1^{st}$ and $2^{nd}$ transistors 10L and 10U may be formed as either a p-type or an n-type.

The $1^{st}$ gate structure 115 and the $2^{nd}$ gate structure 125 may each include a gate dielectric layer, a work-function metal layer, and a gate electrode. The gate dielectric layer may include an interfacial layer formed of an oxide material such as silicon oxide (SiO), silicon dioxide ($SiO_2$), and/or silicon oxynitride (SiON), not being limited thereto, and an high-k layer formed of a high-k material such as Hf, Al, Zr, La, Mg, Ba, Ti, Pb, and/or a combination thereof, not being limited thereto. The work-function metal layer may be formed of a metal such as Cu, Al, Ti, Ta, W, Co, TiN, WN, TiAl, TiAlN, TaN, TiC, TaC, TiAlC, TaCN, TaSiN, and/or a combination thereof, not being limited thereto. However, the work-function metal layers of the two gate structures 115 and 125 may be different from each other so that they may have different threshold voltages. For example, when the $1^{st}$ and $2^{nd}$ transistors 10L are 10U are of n-type and p-type, respectively, the $1^{st}$ gate structure 115 of the $1^{st}$ transistor 10L may include a work-function metal layer formed of Al or TiC, and the $2^{nd}$ gate structure 125 of the $2^{nd}$ transistor 10U may include a work-function metal layer formed of TiN. The gate electrode may be formed of Cu, W, Al, Ru, Mo, Co, and/or a combination thereof, not being limited thereof.

The $2^{nd}$ source/drain region 145 may have a smaller width than the $1^{st}$ source/drain region 135 in the D2 direction as shown in FIG. 1C. This is because the $2^{nd}$ channel layers 122, based on which the $2^{nd}$ source/drain region 145 is formed, may have a smaller width than the $1^{st}$ channel layers 112 based on which the $1^{st}$ source/drain region 135 is formed. Due to this width difference between the $2^{nd}$ source/drain region 145 and the $1^{st}$ source/drain region 135, $1^{st}$ contact structures 119 may be formed on top surfaces of the 1$^{st}$ source/drain region 135 without contacting the 2$^{nd}$ source/drain region 145, respectively. 2$^{nd}$ contact structures 129 may be formed on top surfaces of the 2$^{nd}$ source/drain regions 145, respectively. The contact structures 119 and 129 may connect the transistors 10L and 10U to one or more voltage sources or other circuit elements for internal routing purposes. The contact structures 119 and 129 may be formed of a metal such as Cu, W, Al, Ru, Mo, Co, and the like, and various compounds or alloys thereof.

The gate structures 115 and 125 may be isolated from the source/drain regions 135 and 145 by inner spacers 116 formed therebetween. The gate structures 115 and 125 in each of the semiconductor stacks 10A-10C may be protected by the gate spacer 151 which prevents the gate structures from being oxidized in a process of manufacturing the 3D-stacked semiconductor device 10. The inner spacer 116 may be formed of silicon nitride (e.g., SiN, SiBCN, SiCN, SiOCN, etc.), not being limited thereto. The gate spacers 151 may be formed of silicon oxide or silicon nitride (e.g., $SiO_2$, SiN, SiBCN, SiCN, SiOC, SiOCN, etc.), not being limited thereto, which may be different from the material(s) forming the inner spacers 116 at least in terms of etch selectivity.

A shallow trench isolation (STI) structure 108 that isolates the 3D-stacked semiconductor device 10 from one or more adjacent semiconductor devices or circuit element may be formed at upper-left and upper-right corners of the substrate 101 with an STI liner 106 therebetween. The STI structure 108 may include silicon oxide (e.g., SiO or $SiO_2$), not being limited thereto, and the STI liner 106 may include silicon nitride (e.g., SiN or $Si_3N_4$), not being limited thereto.

A 1$^{st}$ frontside isolation structure 141 between the 1$^{st}$ source/drain region 135 and the 2$^{nd}$ source/drain region 145, and a 2$^{nd}$ frontside isolation structure 142 above the 2$^{nd}$ source/drain regions 145 may be formed to isolate the source/drain regions 135 and 145 from each other or from other circuit elements. The frontside isolation structures 141 and 142 may both be formed of silicon oxide (e.g., SiO or $SiO_2$), not being limited thereto. Further, a 1$^{st}$ protection layer 136 may be formed on the 1$^{st}$ source/drain regions 135 at least to prevent oxidation thereof from the 1$^{st}$ frontside isolation structure 141, and a 2$^{nd}$ protection layer 146 may be formed on the 2$^{nd}$ source/drain regions 145 at least to prevent oxidation thereof from the 2$^{nd}$ frontside isolation structure 142.

A middle isolation structure 140 may be formed between the 1$^{st}$ gate structure 115 and the 2$^{nd}$ gate structure 125 to isolate these two gate structures. The middle isolation structure 140 may be formed of a dielectric material such as silicon nitride (e.g., SiBCN, SiCN, SiOCN, SiN, etc.), not being limited thereto. Between the middle isolation structure 140 and the 1$^{st}$ frontside isolation structure 141 may be formed a 1$^{st}$ blocking layer 133 and a 2$^{nd}$ blocking layer 134 that are used to cover the 2$^{nd}$ channel structure 120 when the 1$^{st}$ source/drain regions are formed in the process of manufacturing the 3D-stacked semiconductor device 10. The 1$^{st}$ blocking layer 133 may include a material such as a silicon oxide (e.g., SiO, $SiO_2$, etc.), and the 2$^{nd}$ blocking layer 134 may include a material such as a silicon nitride (e.g., SiN, $Si_3N_4$, etc.), not being limited thereto.

The middle isolation structure 140 may have replaced a silicon germanium (SiGe) layer with a high germanium (Ge) concentration (e.g., Ge concentration of 55%) epitaxially grown from an underlying SiGe layer with a low Ge concentration (e.g., Ge concentration of 25%) which is used to form the 1$^{st}$ channel structure 110 in the process of manufacturing the 3D-stacked semiconductor device 10. However, the SiGe layer with a high Ge concentration cannot be grown above a critical thickness at or above which the 1$^{st}$ channel structure 110 may collapse because of the material characteristics. Thus, the middle isolation structure 140 replacing this Ge-rich SiGe layer may not also have a sufficient thickness that can reliably isolate the 1$^{st}$ gate structure 115 and the 2$^{nd}$ gate structure 125 from each other. It is understood here that the SiGe layer with Ge concentration 55% means that 55% of the entire material forming the SiGe layer is Ge, and the SiGe layer with Ge concentration 25% means that 25% of the entire material forming the SiGe layer is Ge.

Thus, the disclosure also provides an embodiment of a 3D-stacked semiconductor device in which a lower transistor and an upper transistor are isolated from each other through a different middle isolation structure.

Figure 2:
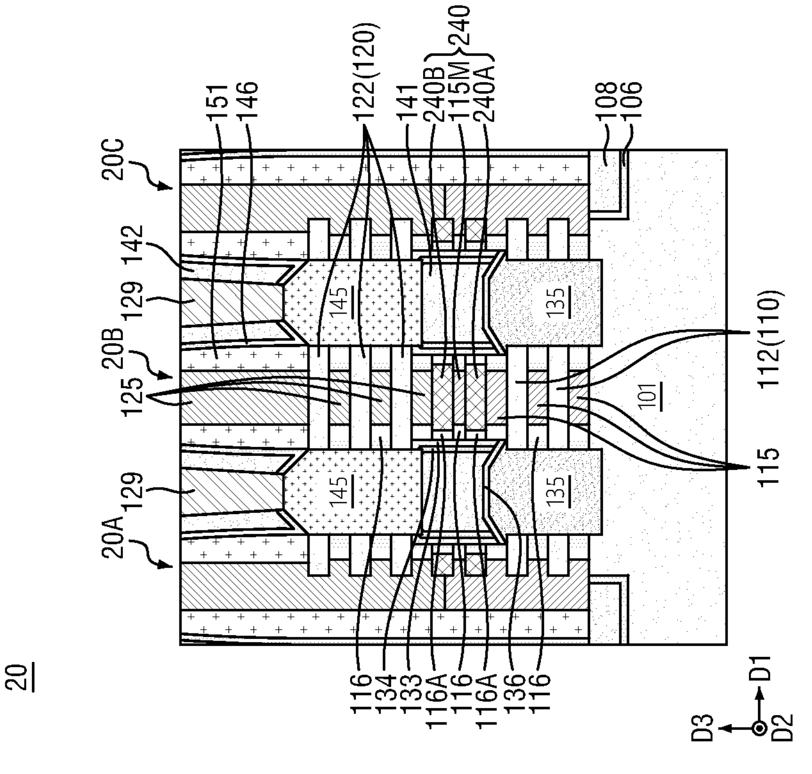
FIG. 2 illustrates a cross-section view of a 3D-stacked semiconductor device including a middle isolation structure formed of a plurality of semiconductor layers, according to an embodiment.

FIG. 2 illustrates a cross-section view of a 3D-stacked semiconductor device including a middle isolation structure formed of a plurality of semiconductor layers, according to an embodiment.

Referring to FIG. 2, a 3D-stacked semiconductor device 20 may include 1$^{st}$ to 3$^{rd}$ semiconductor stacks 20A, 20B and 20C which may form the same transistor structure including the 1$^{st}$ transistor 10L and the 2$^{nd}$ transistor 10U as the 3D-stacked semiconductor device 10 of FIGS. 1A and 1B. Thus, while duplicate descriptions thereof may be omitted, different aspects of the 3D-stacked semiconductor device 20 are described herebelow.

The 3D-stacked semiconductor device 20 may include a middle isolation structure 240, which is different from the middle isolation structure 140, to isolate the 1$^{st}$ gate structure 115 and the 2$^{nd}$ gate structure 125 from each other. The middle isolation structure 240 may include a 1$^{st}$ middle isolation layer 240A and a 2$^{nd}$ middle isolation layer 240B which are vertically stacked with a portion of the 1$^{st}$ gate structure 115 therebetween.

The middle isolation layers 240A and 240B may each be a semiconductor layer including a semiconductor material. For example, these middle isolation layers may have the same material composition as sacrificial layers that have replaced by the 1$^{st}$ gate structure 115 and the 2$^{nd}$ gate structure 125 in the process of manufacturing the 3D-stacked semiconductor device 20, as will be described later. When the sacrificial layers are formed of SiGe, the middle isolation layers 240A and 240B may also be formed of SiGe. However, the middle isolation layers 240A and 240B may have a lower Ge concentration, for example, Ge concentration 10-15%, than the sacrificial layers which may have a high Ge concentration, for example, Ge concentration 25%.

The middle isolation structure 240 may also include a portion 115M of the 1$^{st}$ gate structure 115 which is formed between the middle isolation layers 240A and 240B, and thus does not surround the 1$^{st}$ channel layers 112. Further, this portion of the 1$^{st}$ gate structure 115 may be separated or isolated from the remaining portion of the 1$^{st}$ gate structure 115 even though it was formed as a part of the 1$^{st}$ gate structure 115 in the process of manufacturing a 3D-stacked semiconductor device. Thus, the portion 115M of the 1$^{st}$ gate structure 115 may be a non-functional or dummy gate structure. Instead of just the portion 115M of the 1$^{st}$ gate structure 115, a portion of the 2$^{nd}$ gate structure 125 or a combination of a portion of the 1$^{st}$ gate structure 115 and a portion of the 2$^{nd}$ gate structure 125 may be formed between the middle isolation layers 240A and 240B, according to another embodiment. Alternatively or additionally, a dielectric material such as silicon nitride forming the middle isolation structure 140 of the 3D-stacked semiconductor device 10 shown in FIG. 1B may be formed between the middle isolation layers 240A and 240B, according to still another embodiment.

Although FIG. 2 shows that two middle isolation layers with the portion 115M of the $1^{st}$ gate structure 115 form the middle isolation structure 240, more than two middle isolation layers with the portions 115M of the $1^{st}$ gate structure 115 therebetween may form the middle isolation structure 240. When two or more middle isolation layers, which may each be an SiGe layer with a low Ge concentration, are formed along with the dummy portion of the gate structures and/or a dielectric material, the middle isolation structure 240 may be formed to have a sufficient thickness that may reliably isolate the $1^{st}$ gate structure 115 from the $2^{nd}$ gate structure 125.

The same or similar middle isolation structure 240 may also be formed in a 3D-stacked semiconductor device including a backside power distribution network (BSPDN) which is formed on a back side of the 3D-stacked semiconductor device, and includes backside contact structures.

Figure 3:
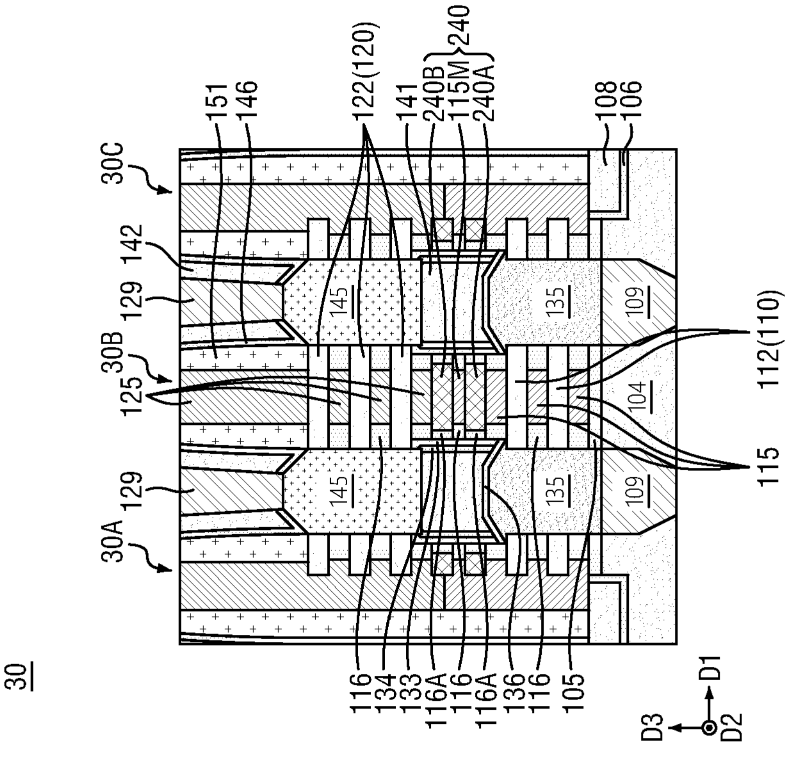
FIG. 3 illustrates a cross-section view of a backside power distribution network (BSPDN)-based 3D-stacked semiconductor device including a middle isolation structure formed of a plurality of semiconductor layers, according to an embodiment.

FIG. 3 illustrates a cross-section view of a BSPDN-based 3D-stacked semiconductor device including a middle isolation structure formed of a plurality of semiconductor layers, according to an embodiment.

Referring to FIG. 3, a 3D-stacked semiconductor device 30 may include $1^{st}$ to $3^{rd}$ semiconductor stacks 30A, 30B and 30C which may form the same transistor structure including the $1^{st}$ transistor 10L and the $2^{nd}$ transistor 10U as the 3D-stacked semiconductor device 20 of FIG. 2. The 3D-stacked semiconductor device 30 may also include the same middle isolation structure 240 included in the 3D-stacked semiconductor device 20. Thus, while duplicate descriptions thereof may be omitted, different aspects of the 3D-stacked semiconductor device 30 are described herebelow.

The 3D-stacked semiconductor device 30 may include backside contact structures 109 formed on bottom surfaces of the $1^{st}$ source/drain regions 135, respectively, in a backside isolation structure 104. The backside contact structures 109 may connect the $1^{st}$ source/drain regions 135 to one or more voltage sources or other circuit elements for internal routing purposes. Thus, the $1^{st}$ contact structures 119, which are frontside contact structures, formed on the top surfaces of the $1^{st}$ source/drain regions 135 in the 3D-stacked semiconductor devices 10 and 20 as shown FIGS. 1C and 2 may not be formed in the 3D-stacked semiconductor device 30.

The backside isolation structure 104 may have replaced the substrate 101 in the process of manufacturing the 3D-stacked semiconductor device 30, as will be described later.

In addition to the backside contact structures 109, the 3D-stacked semiconductor device 30 may include a bottom isolation layer 105 that prevents current leakage from the $1^{st}$ gate structure 115 to the backside isolation structure 104 in which the backside contact structures 109 are formed. The bottom isolation layer 105 may be formed of the same material forming the inner spacers 116, for example, silicon nitride such as SiN, SiBCN, SiCN, SiOCN, etc., and thus, the bottom isolation layer 105 and the inner spacers 116 may be formed at the same time in the process of manufacturing the 3D-stacked semiconductor device 30 to simplify the manufacturing process thereof.

As described above, the 3D-stacked semiconductor device 30 with a BSPDN including the backside contact structures 109 may also include the middle isolation structure 240. Thus, the 3D-stacked semiconductor device 30 may also achieve more reliable isolation between the $1^{st}$ and $2^{nd}$ gate structures 115 and 125.

In the above embodiments, the $2^{nd}$ channel structure 120 of the $2^{nd}$ transistor 10U has three channel layers 122 while the $1^{st}$ channel structure 110 of the $1^{st}$ transistor 10L has two channel layers 112. However, the disclosure is not limited thereto, and more or less than two channel layers may form the $1^{st}$ channel structure 110, and more or less than three channel layers may form the $2^{nd}$ channel structure 120, according to embodiments. Further, in the above embodiments, each of the $1^{st}$ and $2^{nd}$ channel structures 110 and 120 is formed of a plurality of channel layers, which are nanosheet layers, to form each of the $1^{st}$ and $2^{nd}$ transistors 10L and 10U as a nanosheet transistor. However, the disclosure is not limited thereto, and each of the $1^{st}$ and $2^{nd}$ channel structures 110 and 120 may include a plurality of channel layers to form a nanosheet transistor or a forksheet transistor, or one or more fin structures to form a FinFET, according to embodiments.

Herebelow, a method of manufacturing a BSPDN-based 3D-stacked semiconductor device including a middle isolation structure formed of a plurality of semiconductor layers, according embodiments.

Figure 4B:
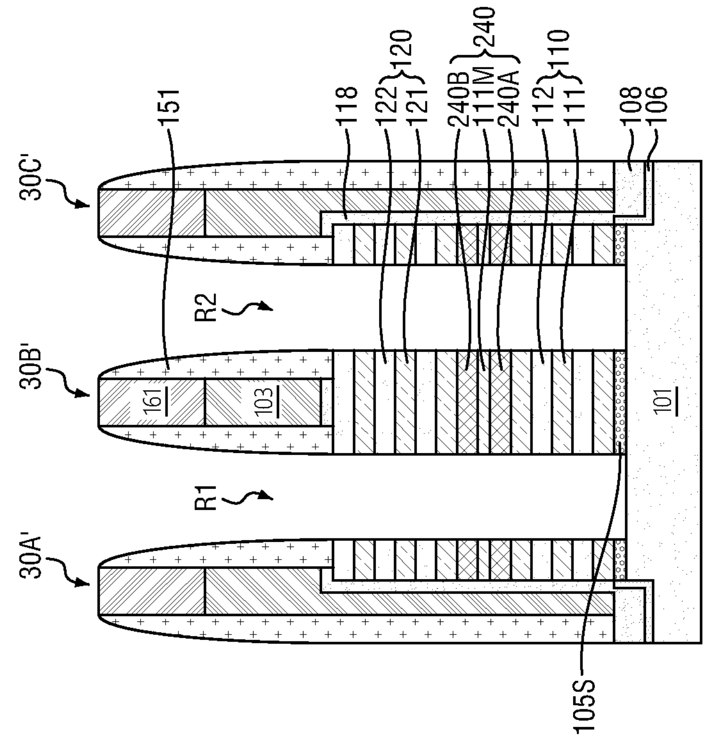
FIGS. 4A-4N illustrate intermediate semiconductor devices obtained after respective steps of forming a BSPDN-based 3D-stacked semiconductor device including a middle isolation structure formed of a plurality of semiconductor layers, according embodiments.
Figure 4A:
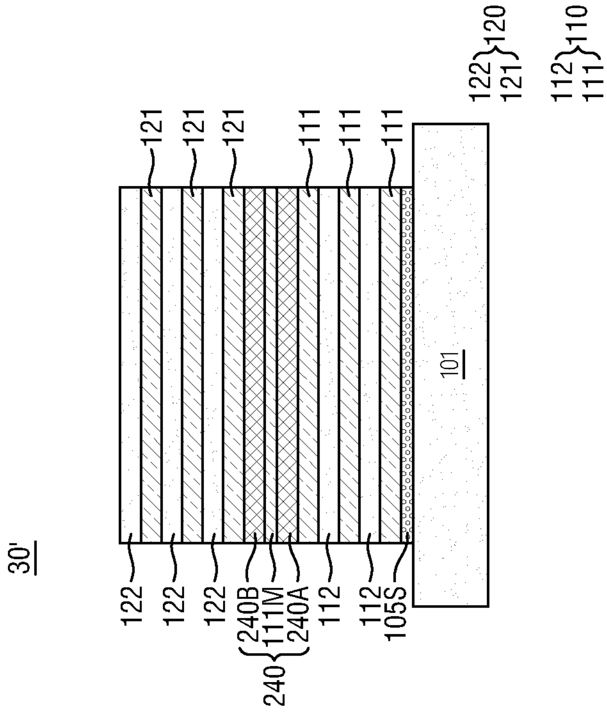
Figure 4D:
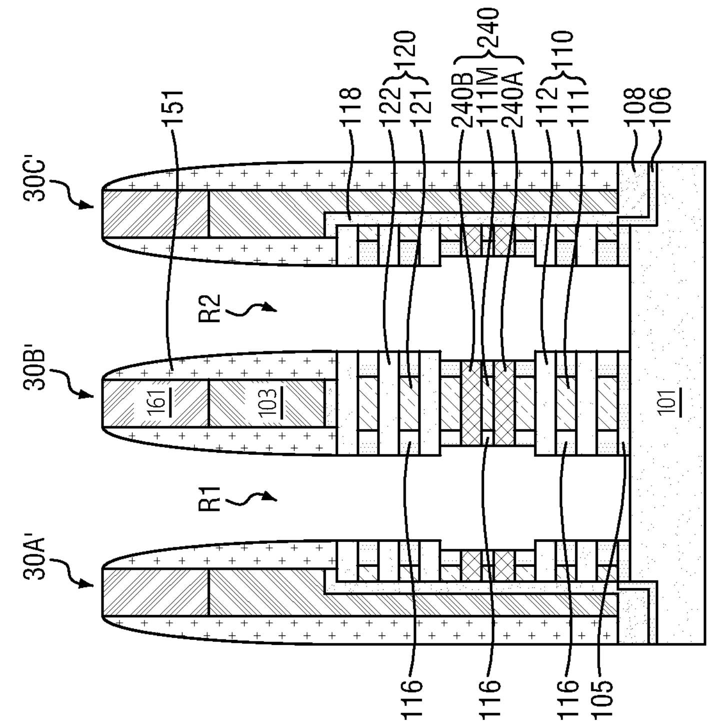
Figure 4C:
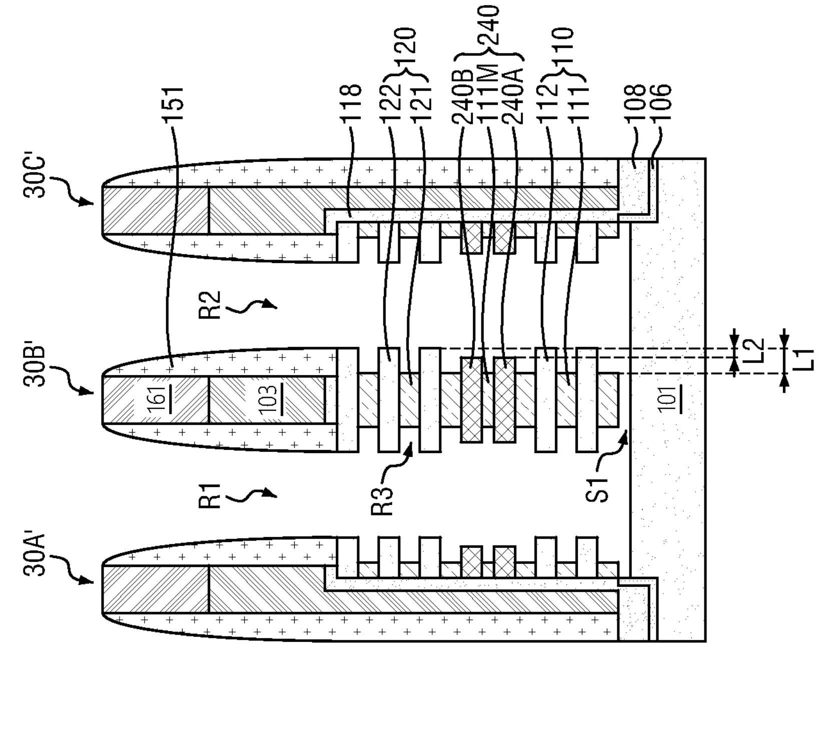
Figure 4E:
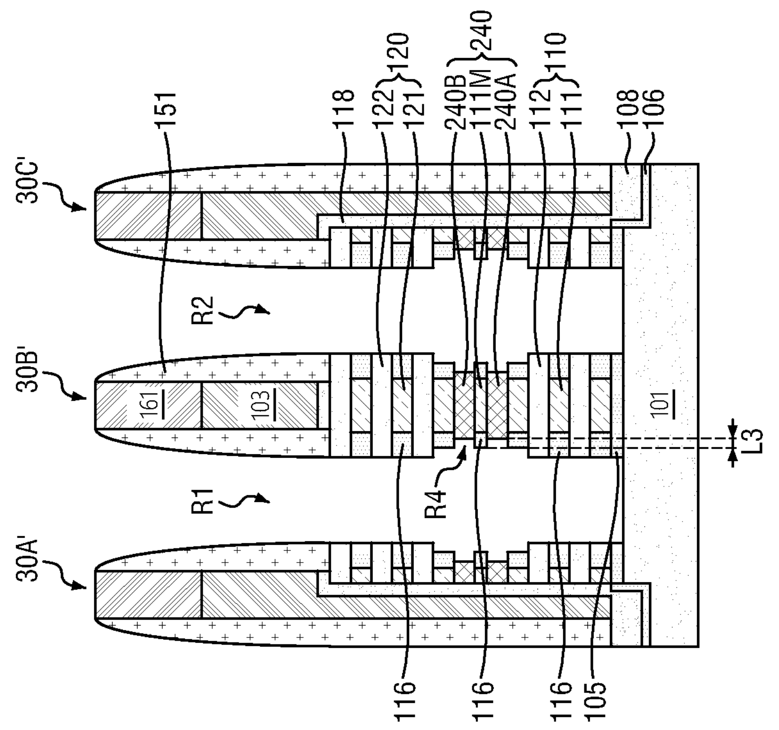
Figure 4F:
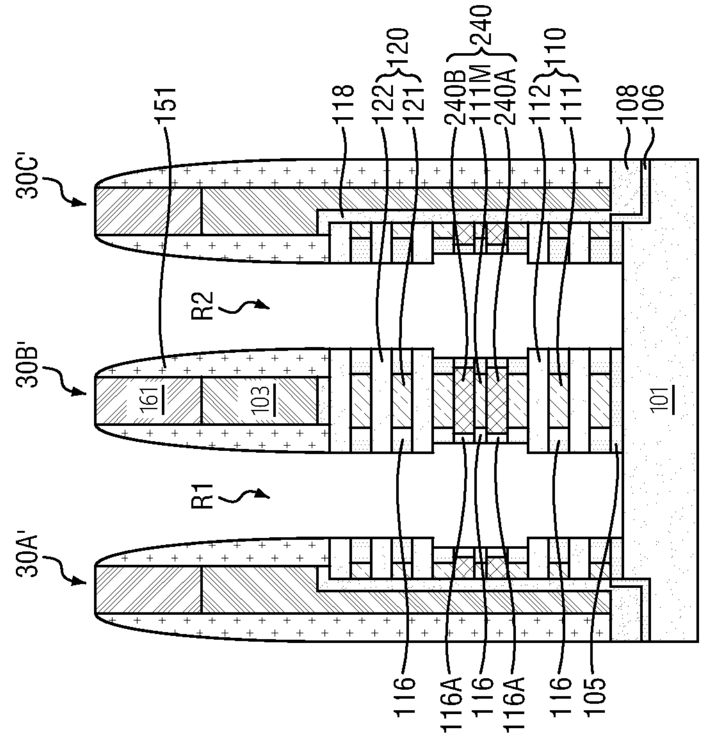
Figure 4G:
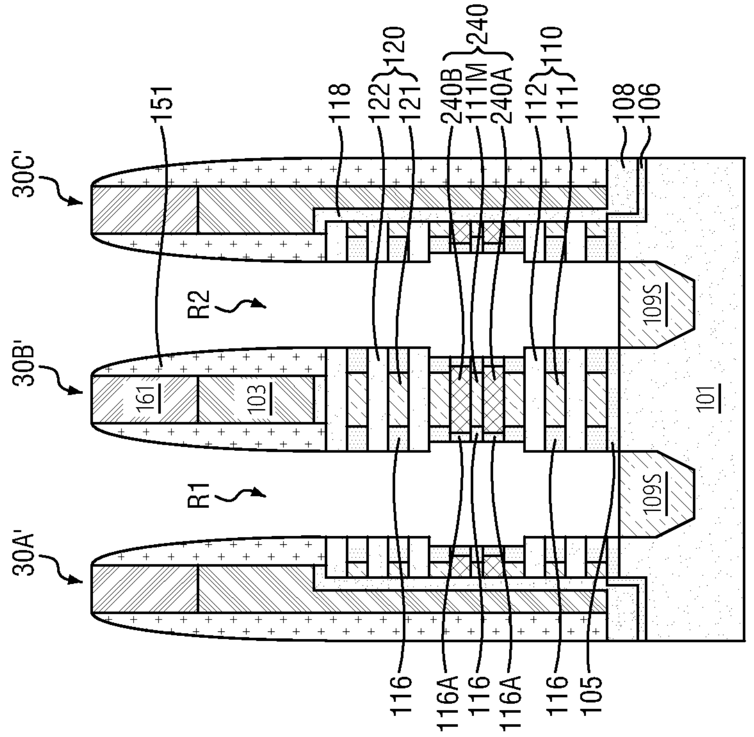
Figure 4H:
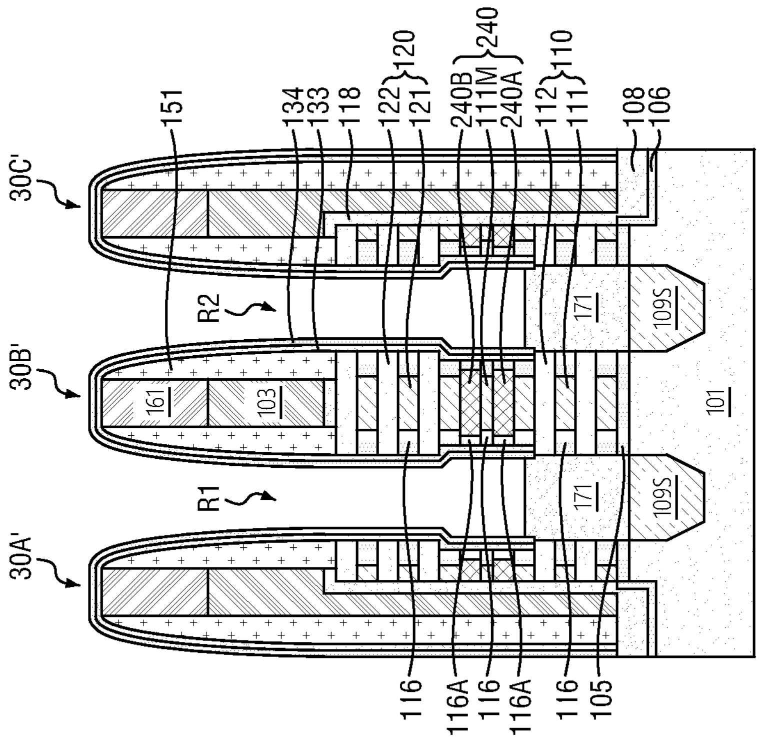
Figure 4I:
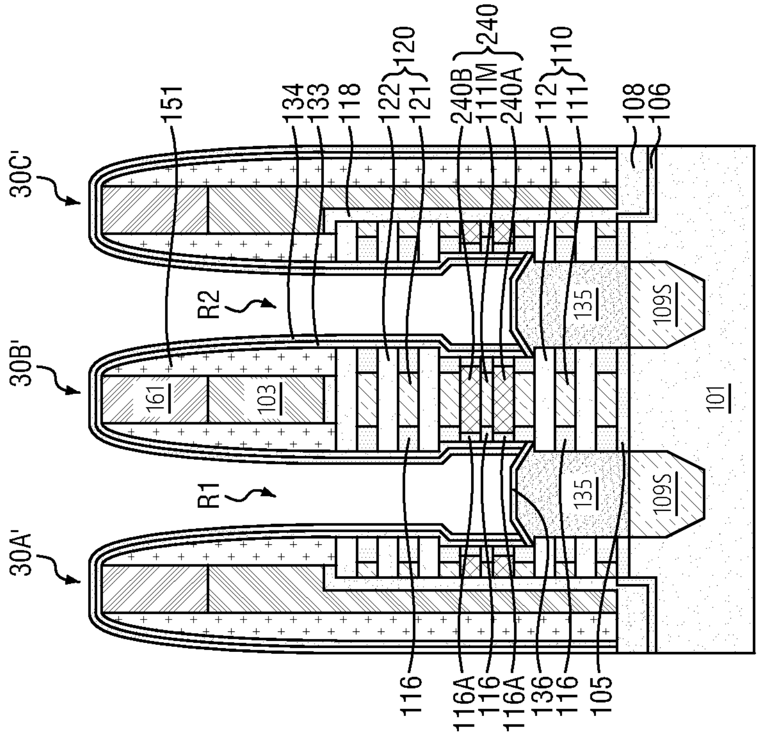
Figure 4J:
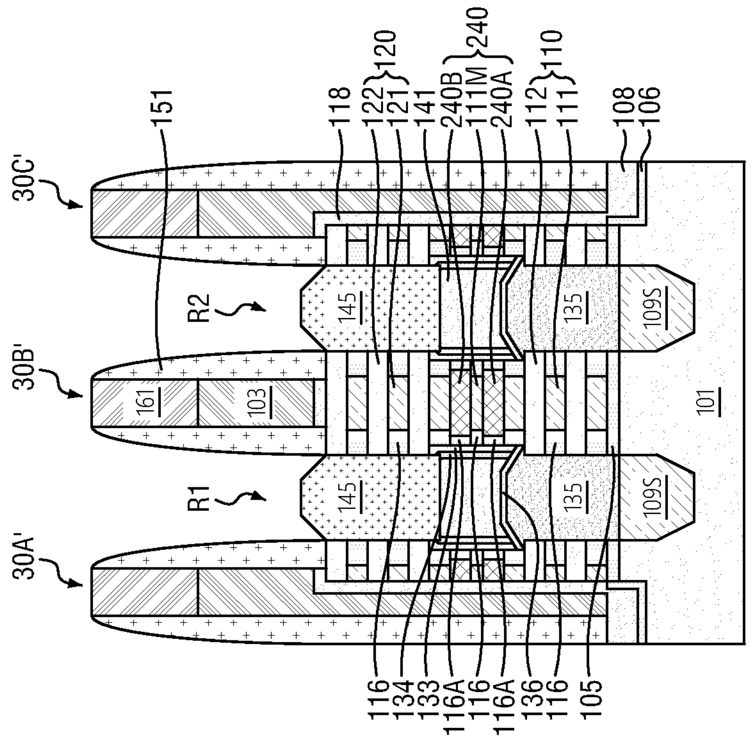
Figure 4L:
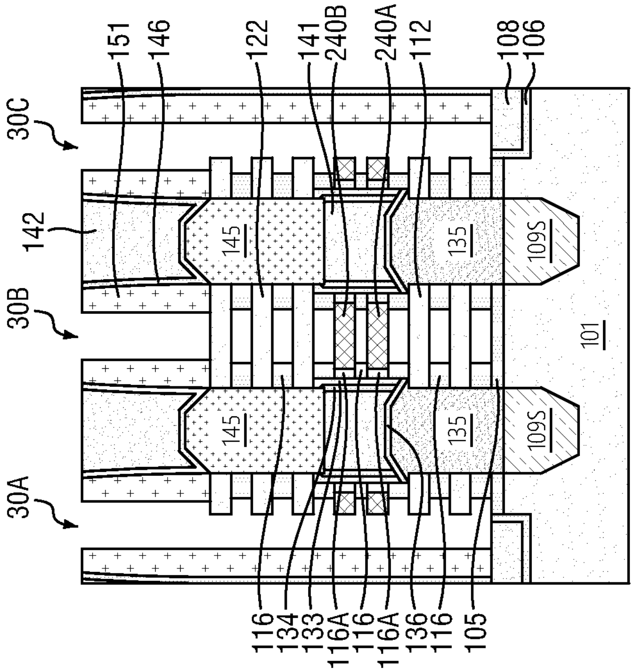
Figure 4K:
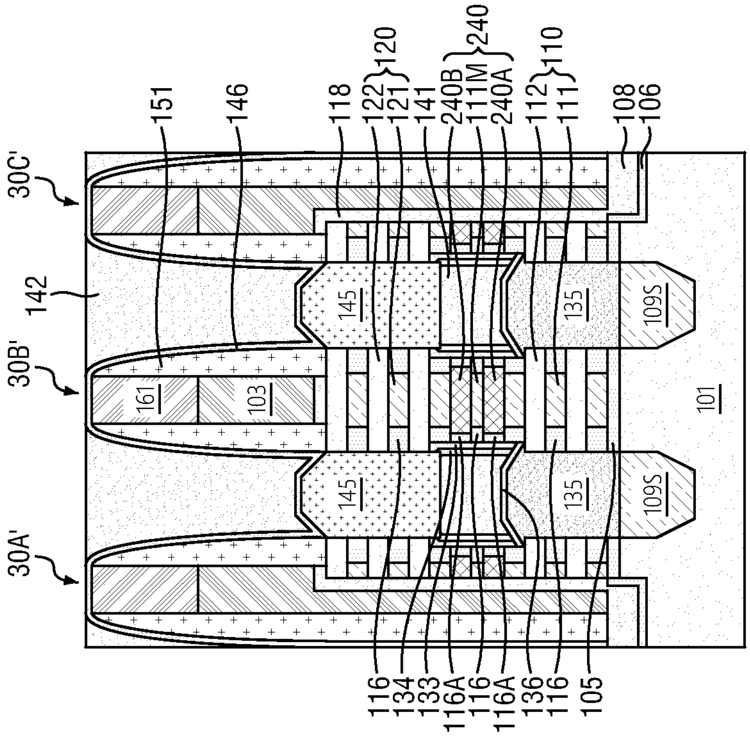
Figure 4M:
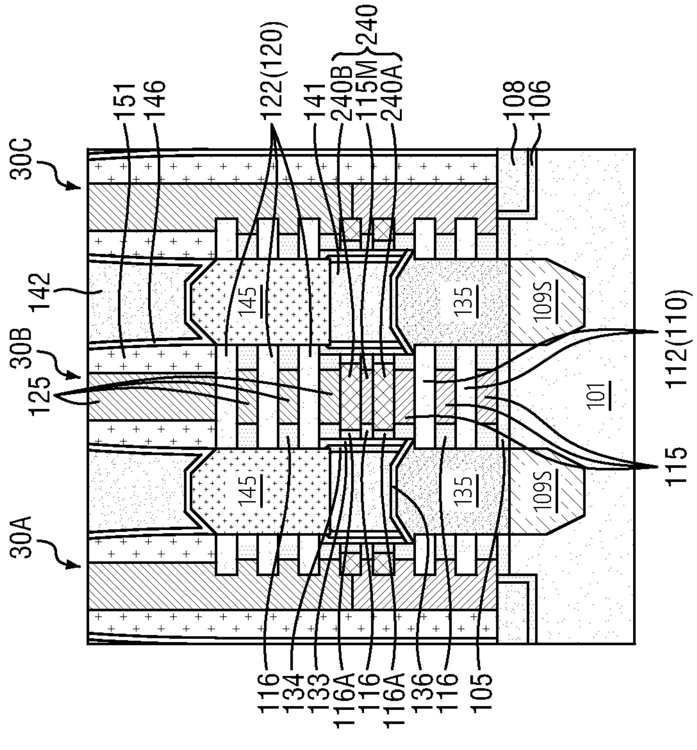
Figure 4N:
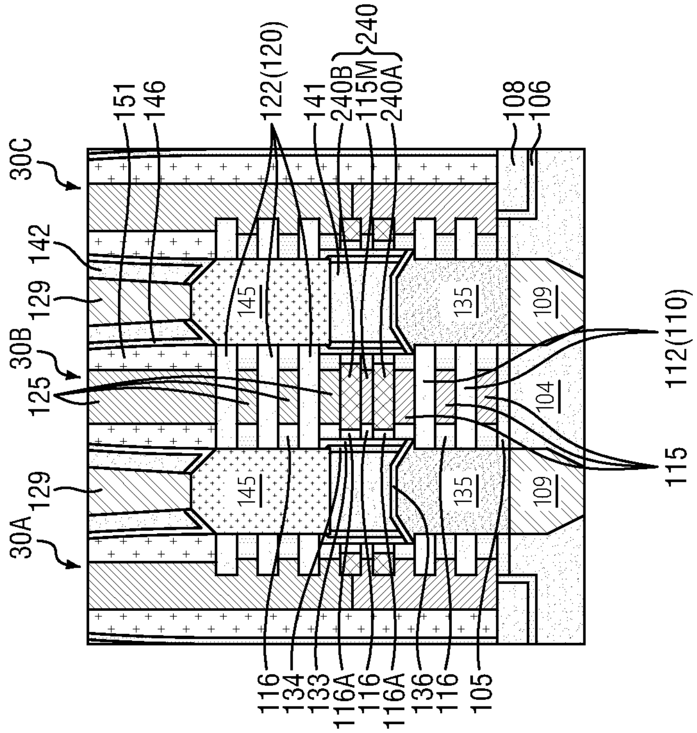

FIGS. 4A-4N illustrate intermediate semiconductor devices obtained after respective steps of forming a BSPDN-based 3D-stacked semiconductor device including a middle isolation structure formed of a plurality of semiconductor layers, according embodiments.

As the semiconductor device manufactured through the respective steps as shown in FIGS. 4A-4N may be the same as or may correspond to the BSPDN-based 3D-stacked semiconductor device 30 shown in FIG. 3, duplicate descriptions thereof may be omitted and the same reference numbers may be used in the descriptions herebelow.

Referring to FIG. 4A, an initial semiconductor stack 30' may be formed by epitaxially growing a plurality of semiconductor layers on a substrate 101 in the order of a bottom sacrificial layer 105S, a $1^{st}$ channel structure 110, a middle isolation structure 240, and a $2^{nd}$ channel structure 120.

The $1^{st}$ channel structure 110 may include $1^{st}$ sacrificial layers 111 and $1^{st}$ channel layers 112 vertically stacked in an alternating manner on the substrate 101 with the bottoms sacrificial layer 105S therebetween. A $1^{st}$ channel layer 112 may be interposed between two adjacent $1^{st}$ sacrificial layers 111. On the $1^{st}$ channel structure 110 may be formed the middle isolation structure 240 which includes two or more middle isolation layers 240A and 240B with one or more middle sacrificial layer 111M therebetween. The $2^{nd}$ channel structure 120 may include $2^{nd}$ sacrificial layers 121 and $2^{nd}$ channel layers 122 vertically stacked in an alternating manner on the middle isolation structure 240. A $2^{nd}$ channel layer 122 may be interposed between two adjacent $2^{nd}$ sacrificial layer 121.

While the substrate 101 and the channel layers 112 and 122 are formed of silicon (Si), the sacrificial layers 105S, 111, 111M and 121 and the middle isolation layers 240A and 240B may be formed of silicon germanium (SiGe) with respective Ge concentrations therein. The bottom sacrificial layer 105S may have a higher Ge concentration than the $1^{st}$ and $2^{nd}$ sacrificial layers 111 and 121 and the middle sacrificial layer 111M, which in turn may have a higher Ge concentration than the middle isolation layers 240A and 240B. For example, the bottom sacrificial layer 105S may have Ge concentration 40-45%, the $1^{st}$ and $2^{nd}$ sacrificial layers 111 and 121 and the middle sacrificial layer 111M may have Ge concentration 25-30%, and the middle isolation layers 240A and 240B may have Ge concentration 10-15%. However, the disclosure is not limited to these specific percentages as long as the order of Ge concentration between these layers is maintained.

Here, the sacrificial layers 105S, 111, 111M and 121 are termed as such because these layers will be removed and replaced by other layers or structures in later steps of manufacturing a 3D-stacked semiconductor device.

Referring to FIG. 4B, the substrate 101 may be patterned to form a shallow trench isolation (STI) structure 108 that will isolate a semiconductor device formed on the substrate 101 from an adjacent device or circuit element. An STI liner 106 may be formed before the STI structure 108 is formed on the substrate 101.

A barrier layer 118 may be formed to surround the initial semiconductor stack 30' of FIG. 4A to protect at least the channel layers 112 and 122 in subsequent processes of manufacturing a 3D-stacked semiconductor device, and then, an initial dummy gate structure with hard mask patterns 161 thereon may be formed on the initial semiconductor stack 30' with the barrier layer 118 therebetween. The initial dummy gate structure and the barrier layer 118 may be patterned through, for example, directional dry etching such as reactive ion etching (RIE), based on the hard mask patterns 161 to obtain three dummy gate structures 103 on the initial semiconductor stack 30', and gate spacers 151 may be formed on side surfaces of the dummy gate structures 103. Further, the initial semiconductor stack 30' may be patterned through, for example, drying etching (e.g., RIE), to form three intermediate semiconductor stacks 30A'-30C' based on the hard mask patterns 161 and the gate spacers 151 as a masking structure. The dummy gate structures 103 may include a material such as amorphous silicon (a-Si) or polysilicon (p-Si), not being limited thereto. The gate spacers 151 may be formed of silicon oxide or silicon nitride (e.g., $SiO_2$, SiN, SiBCN, SiCN, SiOC, SiOCN, etc.), not being limited thereto. The barrier layer 118 may be formed of silicon oxide (e.g., SiO or $SiO_2$), not being limited thereto. The hard mask patterns 161 may include a dielectric material such as silicon nitride (SiN), titanium nitride (TiN), or silicon oxynitride (SiON), not being limited thereto.

The patterning of the initial semiconductor stack 30' may be performed such that two recesses R1 and R2 are formed to divide the initial semiconductor stack 30' into the intermediate semiconductor stacks 30A'-30C', and each of the recesses R1 and R2 exposes a top surface of the substrate 101 and side surfaces of the bottom sacrificial layer 105S, the $1^{st}$ channel structure 110, the middle isolation structure 240, and the $2^{nd}$ channel structure 120 in their divided form.

The gate spacer 151 may isolate or protect a gate structure which may replace each of the dummy gate structures 103 in a later step from other circuit elements. The barrier layer 118 may be formed to protect the $1^{st}$ and $2^{nd}$ channel structures 110 and 120 from subsequent operations of manufacturing a 3D-stacked semiconductor device.

Referring to FIG. 4C, a selective etching operation may be performed on the side surfaces of the $1^{st}$ channel structure 110, the middle isolation structure 240, and the $2^{nd}$ channel structure 120 of each of the intermediate semiconductor stacks 30A'-30C' exposed though the recesses R1 and R2.

The etching operation in this step may remove the bottom sacrificial layer 105S, and pull back a portion of each of the $1^{st}$ sacrificial layers 111, the middle isolation layers 240A, 240B, the middle sacrificial layer 111M, and the $2^{nd}$ sacrificial layers 121 from the side surface thereof exposed through the recesses R1 and R2. For example, dry etching or wet etching may be applied using, for example, hydrofluoric acid (HF), which etches a Ge or SiGe component in these layers 105S, 111, 240A, 240B, 111M and 121 without attacking the channel layers 112 and 122 formed of silicon (Si).

However, as the layers 105S, 111, 240A, 240B, 111M and 121 have different Ge concentrations as described above in reference to FIG. 4A, an amount of the Ge or SiGe component etched in these layers in a unit time may also differ in this selective etching operation. For example, after the selective etching, the bottom sacrificial layer 105S having Ge concentration 45-50% may be entirely removed, and each of the $1^{st}$ and $2^{nd}$ sacrificial layer 111 and 121 and the middle sacrificial layer 111M having Ge concentration 25-30% may be etched at each side surface thereof by a $1^{st}$ length L1 in the D1 direction. Further, after this selective etching, each of the middle isolation layers 240A and 240B having Ge concentration 10-15% may be etched at each side surface thereof by a $2^{nd}$ length L2 which is smaller than the $1^{st}$ length L1 in the D1 direction. Thus, the middle isolation layers 240A and 240B may have a greater length than the sacrificial layers 111, 111M and 121, although the middle isolation layers 240A and 240B have a shorter length than the channel layers 112 and 122 including silicon (Si) which may not be affected by the selective etching.

Due to the selective etching operation in this step, a space Si may be formed at a place where the bottom sacrificial layer 105S is formed and removed, and further, a side recess R3 may be formed at each side surface of the sacrificial layers 111, 111M and 121 between two vertically adjacent layers, among the $1^{st}$ channel layers 112, the middle isolation layers 240A and 240B, and the $2^{nd}$ channel layers 122. The side recess R3 may also be formed at each side surface of the lowermost $1^{st}$ sacrificial layer 111 below the lowermost $1^{st}$ channel layer 112 above the substrate 101.

Referring to FIG. 4D, a bottom isolation layer 105 may be formed in the space Si from which the bottom sacrificial layer 105S is removed, and inner spacers 116 may be formed in the side recesses R3 formed the side surfaces of the sacrificial layers 111, 111M and 121, in each of the intermediate semiconductor stacks 30A'-30C'.

The formation of the bottom isolation layer 105 and the inner spacers 116 may be performed by depositing an inner spacer material such as silicon nitride (e.g., SiN, SiBCN, SiCN, SiOCN, etc.) in the recesses R1 and R2 through, for example, atomic layer deposition (ALD), physical vapor deposition (PVD), plasma enhanced atomic layer deposition (PEALD), chemical vapor deposition (CVD), plasma enhanced chemical vapor deposition (PECVD), or a combination thereof, not being limited thereto. At this time, side surfaces of the intermediate semiconductor stacks 30A'-30C' in the recesses R1 and R2 may be covered by this inner spacer material, and also, the space Si and the side recesses R3 side surfaces obtained in the previous step may be filled in with the inner spacer material. Further, wet etching or dry etching may be performed on the inner spacer material until side surfaces of the gate spacers 151, the channel layers 112, 122 and the middle isolation layers 240A, 240B are exposed again in the recesses R1 and R2 while the inner spacer material filled in the space Si and the side recesses R3 may remain to cover the side surfaces of the sacrificial layers 111, 121 and 111M. For example, wet etching using, for example, phosphoric acid, not being limited thereto, may be performed on the inner spacer material against the materials forming the gate spacer 151, the channel layers 112, 122 and the middle isolation layers 240A, 240B such that the inner spacer material formed thereon is pinched off to remain only in the space Si and the side recesses R3. Alternatively or additionally, anisotropic dry etching (e.g., RIE) using chlorine- or fluorine-based gas may be performed on the inner spacer material to obtain the inner spacers 116 as shown in FIG. 4D.

Through the above process of forming the inner spacers 116, side surfaces of the inner spacers 116 between two adjacent channel layers among the 1st and 2nd channel layers 112 and 122 may be vertically aligned or coplanar with side surfaces of the two adjacent channel layers, and also, side surfaces of the inner spacers 116 between, directly above, or directly below the middle isolation layers 240A and 240B may be vertically aligned or coplanar with side surfaces of these middle isolation layers. Thus, all of the inner spacers 116 may not be vertically aligned or coplanar with each other. The dry etching or wet etching may also be performed on side surfaces of the bottom isolation layer 105 such that side surfaces thereof are vertically aligned or coplanar with the side surfaces of the lowermost inner spacers 116 formed directly thereabove.

Here, the bottom isolation layer 105 and the inner spacers 116 may be formed at the same time in this step, thereby to simplify a manufacturing process for a 3D-stacked semiconductor device. This is at least because the bottom isolation layer 105 and the inner spacers 116 can be formed of the same material such as silicon nitride (e.g., SiN, SiBCN, SiCN, SiOCN, etc.).

Referring to FIG. 4E, in each of the intermediate semiconductor stacks 30A'-30C', another selective etching operation may be performed on the side surfaces of the middle isolation layers 240A and 240B to form a side recess R4 where an additional inner spacers are to be formed in a next step to protect these middle isolation layers from subsequent operations of manufacturing a 3D-stacked semiconductor device.

Dry etching or wet etching using, for example, hydrofluoric acid (HF), may be applied to the side surfaces of the middle isolation layers 240A and 240B exposed through the recesses R1 and R2 to remove a portion of each of the middle isolation layers from each side surface thereof by a 3rd length L3 which is smaller than a length of the inner spacer 116 in the D1 direction.

Referring to FIG. 4F, an additional inner spacer 116A may be formed in the side recess R4 formed at each side surface of each of the middle isolation layers 240A and 240B exposed through the recesses R1 and R2.

The formation of the additional inner spacers 116A may be performed through, for example, ALD, PEALD, PVD, CVD, PECVD or a combination thereof, such that the additional inner spacers 116A are connected to the inner spacers 116 directly therebelow and thereabove. Subsequently, dry etching or wet etching may be performed on side surfaces of the additional inner spacers 116A in the recesses R1 and R2 such that the side surfaces thereof are vertically aligned or coplanar with the side surfaces of the inner spacers 116 connected thereto.

Referring to FIG. 4G, a placeholder structure 109S may be formed in the substrate 101 in each of the recesses R1 and R2 by forming a hole penetrating into the substrate 101 by a predetermined depth and filling the hole with the placeholder structure 109S.

The placeholder structure 109S may be formed to reserve a space for formation of a backside contact structure to be connected to a bottom surface of a source/drain region to be formed thereabove in a later step. A material forming the placeholder structure 109S may be, for example, silicon germanium (SiGe), not being limited thereto.

The formation of the placeholder structure 109S in this step may be performed through, for example, dry etching on the substrate 101 exposed through each of the recesses R1 and R2 to form a hole where a placeholder structure is to be formed, and performing PVD, CVD, PECVD or a combination thereof of SiGe in the hole to form the placeholder structure 109S. Further, planarization such as chemical-mechanical polishing (CMP) of the placeholder structure 109S may be performed so that a top surface thereof may be at a level below a bottom surface of the lowermost 1st sacrificial layer 111 or the lowermost 1st channel layer 112.

Referring to FIG. 4H, a passivation structure 171 may be formed in each of the recesses R1 and R2 on the top surface of the placeholder structure 109S such that the passivation structure 171 covers the side surfaces of the 1st channel structure 110 including the 1st channel layers 112 and the inner spacers 116 of each of the intermediate semiconductor stacks 30A'-30C' in each of the recesses R1 and R2. Further, a 1st blocking layer 133 and a 2nd blocking layer 134 may be conformally formed on an outer surface of each of the intermediate semiconductor stacks 30A'-30C' except the side surfaces of the 1st channel layers 112 and the inner spacers 116 covered by the passivation structure 171.

The formation of the passivation structure 171 may be performed through, for example, PVD, CVD, PECVD or a combination thereof of a spin-on-glass (SOG) material such as silicon oxide (e.g., SiO, $SiO_2$, etc.), followed by dry etching such that a top surface of the passivation structure 171 is at a level above a top surface of the uppermost 1st channel layer 112 to protect the 1st channel structure 110 including the 1st channel layers 112 when the blocking layers 133 and 134 are formed on each of the intermediate semiconductor stacks 30A'-30C'.

For each of the intermediate semiconductor stacks 30A'-30C', the 1st blocking layer 133 may be layered on side surfaces of the gate spacer 151, the 2nd channel layers 122, the inner spacers 116 and the additional inner spacers 116A exposed through the recesses R1 and R2, and the 2nd blocking layer 134 may be layered on the 1st blocking layer 133.

In each of the recesses R1 and R2, the blocking layers 133 and 134 may be formed to protect the 2nd channel layers 122 when source/drain regions are formed from the 1st channel layers 112 in a later step. The 1st blocking layer 133 may also protect the gate spacer 151 in a later step when the 2nd blocking layer 134 is removed. The formation of the blocking layers 133 and 134 may be performed through, for example, atomic layer deposition (ALD), not being limited thereto. The 1st blocking layer 133 may include a material such as a silicon oxide (e.g., SiO, $SiO_2$, etc.), and the 2nd blocking layer 134 may include a material such as a silicon nitride (e.g., SiN, $Si_3N_4$, etc.), not being limited thereto.

Referring to FIG. 4I, the passivation structures 171 may be removed to expose the 1st channel structure 110 and the top surfaces of the placeholder structures 109S in the recesses R1 and R2 again, and 1st source/drain regions 135 may be formed in spaces from which the passivation structures 171 are removed. At this time, the 2nd channel structure 120 including the 2nd channel layers 122 may still be covered by the blocking layers 133 and 134. Further, 1st protection layers 136 may be formed on top surfaces of the 1st source/drain regions 135.

The removal of the passivation structure 171 may be performed through, for example, dry etching, wet etching, stripping or ashing, and the formation of the 1st source/drain regions 135 may be performed through, for example, epitaxy based on the substrate 101 and the 1st channel layers 112 of the intermediate semiconductor stacks 30A'-30C' exposed in the recesses R1 and R2. The 1st protection layer 136 may be formed through, for example, atomic layer deposition (ALD) of silicon nitride (e.g., SiN or $Si_3N_4$), not being limited thereto.

In this step, the epitaxy forming the 1st source/drain regions 135 may be selectively performed based on only the 1st channel layers 112 and the substrate 101 because the 2nd channel layers 122 are covered by the blocking layers 133 and 134. The 1st protection layer 136 may be formed on the 1st source/drain regions 135 to protect the 1st source/drain regions 135 from a subsequent operation of epitaxy forming 2nd source/drain regions from the 2nd channel layers 122 in a next step.

Referring to FIG. 4J, a 1st frontside isolation structure 141 may be formed on each of the 1st source/drain regions 135 with the 1st protection layer 136 thereon, and the blocking layers 133 and 134 may be removed to expose the side surfaces of the 2nd channel structure 120 of each of the intermediate semiconductor stacks 30A'-30C' in the recesses R1 and R2. Further, 2nd source/drain regions 145 may be formed based on the 2nd channel layers 121 exposed though the recesses R1 and R2.

The 1st frontside isolation structure 141 may be formed on a top surface of the 1st protection layer 136 and a side surface of a portion of the 2nd blocking layer 134 below a level of a bottom surface of the lowermost 2nd channel layer in each of the intermediate semiconductor stacks 30A'-30C'. The 1st frontside isolation structure 141 may be formed to isolate the 1st source/drain regions 135 from other circuit elements including 2nd source/drain regions to be formed in a next step. The 1st frontside isolation structure 141 may be formed through, for example, deposition of silicon oxide (e.g., SiO or $SiO_2$), not being limited thereto, such as PVD, CVD, PECVD, or their combination, followed by planarization (e.g., CMP) such that a top surface thereof is at a level below the bottom surface of the lowermost 2nd channel layer in each of the intermediate semiconductor stacks 30A'-30C'.

Based on the 1st frontside isolation structure 141, the blocking layers 133 and 134 may be removed from each of the intermediate semiconductor stacks 30A'-30C' through, for example, dry etching or stripping except portions thereof at the side surfaces of the additional inner spacers 116A and the inner spacers 116 above the uppermost 1st channel layers 112 and below the lowermost 2nd channel layers 122.

Further, 2nd source/drain regions 145 may be formed through, for example, epitaxy based on the 2nd channel layers 122 of the intermediate semiconductor stacks 30A'-30C'.

Referring to FIG. 4K, a 2nd protection layer 146 may be formed on each of the intermediate semiconductor stacks 30A'-30C' to cover top surfaces and bottom surfaces of the 2nd source/drain regions 145, and a 2nd frontside isolation structure 142 may be formed on the 2nd protection layer 146.

The 2nd protection layer 146 may be formed through, for example, atomic layer deposition (ALD) of silicon nitride (e.g., SiN or $Si_3N_4$), not being limited thereto, to protect each of the 2nd source/drain regions 145 from subsequent operations. The 2nd frontside isolation structure 142 may be formed through deposition of silicon oxide (e.g., SiO or $SiO_2$), not being limited thereto such as PVD, CVD, PECVD, or a combination thereof, followed by planarization (e.g., CMP) to isolate the 2nd source/drain regions 145 from other circuit elements including the 1st source/drain regions 135.

Referring to FIG. 4L, the hard mask patterns 161 may be removed from each of the intermediate semiconductor stacks 30A'-30C', and the dummy gate structure 103 along with the barrier layer 118, the 1st and 2nd sacrificial layers 111, 121 and the middle sacrificial layer 111M may also be removed following the removal of the hard mask patterns 161.

The removal of the hard mask patterns 161 may be performed through, for example, stripping, ashing, dry etching or wet etching, not being limited thereto. The removal of the dummy gate structures 103, the barrier layer 118, and the sacrificial layers 111, 111M and 121 may be performed through, for example, dry etching, wet etching, or a combination thereof, not being limited thereto, using, for example, hydrofluoric acid (HF), which may remove an SiGe layer with a high Ge concentration (e.g., 25-304) against silicon (Si) and an SiGe layer with a low Ge concentration (e.g., 10-15%). Thus, when the sacrificial layers 111, 111M and 121 having Ge concentration of 25-30% are removed by the dry etching or wet etching, the channel layers 112 and 122 formed of silicon (Si) without a Ge component and the middle isolation layers 240A and 240B having Ge concentration of 10-15% may not be attacked by the etching operation.

Thus, in the intermediate semiconductor stacks 30A'-30C', the channel layers 112 and 122 as well as the middle isolation layers 240A surrounded by the sacrificial layers 111 and 121 may be released to an open space where a gate structure is to be formed in a next step.

Referring to FIG. 4M, a 1st gate structure 115 surrounding the 1st channel layers 112 and a 2nd gate structure 125 surrounding the 2nd channel layers 122 may be formed in the space obtained by the removal of the dummy gate structures 103 and the sacrificial layers 111, 111M and 121.

The formation of the 1st and 2nd gate structures 115 and 125 may be performed through, for example, PVD, CVD, PECVD, ALD, PEALD, or a combination thereof, not being limited thereto.

The 1st gate structure 115 and the 2nd gate structure 125 may each include a gate dielectric layer, a work-function metal layer, and a gate electrode. The gate dielectric layer may include an interfacial layer formed of an oxide material such as silicon oxide (SiO), silicon dioxide ($SiO_2$), and/or silicon oxynitride (SiON), not being limited thereto, and an high-k layer formed of a high-k material such as Hf, Al, Zr, La, Mg, Ba, Ti, Pb, and/or a combination thereof, not being limited thereto. The work-function metal layer may be formed of a metal such as Cu, Al, Ti, Ta, W, Co, TiN, WN, TiAl, TiAlN, TaN, TiC, TaC, TiAlC, TaCN, TaSiN, and/or a combination thereof, not being limited thereto. However, the work-function metal layers of the two gate structures 115 and 125 may be different from each other so that may have different threshold voltages. For example, when the 1st and 2nd transistors 10L are 10U are of n-type and p-type, respectively, the 1st gate structure 115 of the 1st transistor 10L may include a work-function metal layer formed of Al or TiC, and the 2nd gate structure 125 of the 2nd transistor 10U may include a work-function metal layer formed of TiN. The gate electrode may be formed of Cu, W, Al, Ru, Mo, Co, and/or a combination thereof, not being limited thereof.

In the meantime, as the middle sacrificial layer 111M between the middle isolation layers 240A and 240B is also removed in the previous step, a portion 115M of the 1st gate structure 115 may also be formed in a space from which the middle sacrificial layer 111M is removed, i.e., between the middle isolation layers 240A and 240B. However, the portion 115M of the 1st gate structure 115 may be isolated from the remaining portion of the 1st gate structure 115 as well as the 2nd gate structure 125. Further, the portion 115M of the 1st gate structure 115 may not be connected to any of the 1st channel layers 112 and the 2$^{nd}$ channel layers 122, and thus, the portion 115M of the 1$^{st}$ gate structure 115 may be non-functional or dummy when a 3D-stacked semiconductor device is completed.

Thus, the two gate structures 115 and 125 may be isolated from each other by the middle isolation structure 240 including the middle isolation layers 240B and 240B with a dummy portion of the 1$^{st}$ gate structure 115. However, the disclosure is not limited thereto. According to another embodiment, instead of the portion 115M of the 1$^{st}$ gate structure 115, a portion of at least one of the 2$^{nd}$ gate structure 125 and the 1$^{st}$ gate structure 115, which is non-functional or dummy, may be formed in the space from which the middle sacrificial layer 111M is removed. Further, according to still another embodiment, a dielectric material such as silicon nitride may be formed in the space from which the middle sacrificial layer 111M is removed during or after the process of the formation of the 1$^{st}$ and 2$^{nd}$ gate structures 115 and 125. In either embodiment, the middle isolation structure 240 may be formed to have a sufficient thickness to reliably isolate the two gate structures 115 and 125 from each other.

Referring to FIG. 4N, frontside contact structures 119 may be formed on top surfaces of the 2$^{nd}$ source/drain regions 145, respectively, and the placeholder structures 109S may be replaced by backside contact structures 109.

The formation of the frontside contact structures 119 may be performed through, for example, dry etching or wet etching on the 2$^{nd}$ frontside isolation structure 142 to form holes therein exposing top surfaces of the 2$^{nd}$ source/drain regions 145, and forming the frontside contact structures 119 in the holes through, for example, CVD, PVD, PECVD, or a combination thereof.

After the formation of the frontside contact structures 119, intermediate semiconductor stacks 30A'-30C' may be turned upside down, and the substrate 101 may be removed and replaced by a backside isolation structure 104. Further, the placeholder structures 109S may be removed from the backside isolation structure 104, and replaced by the backside contact structures 109 through, for example, dry etching and/or wet etching followed by CVD, PVD, PECVD, or a combination thereof.

Figure 5B:
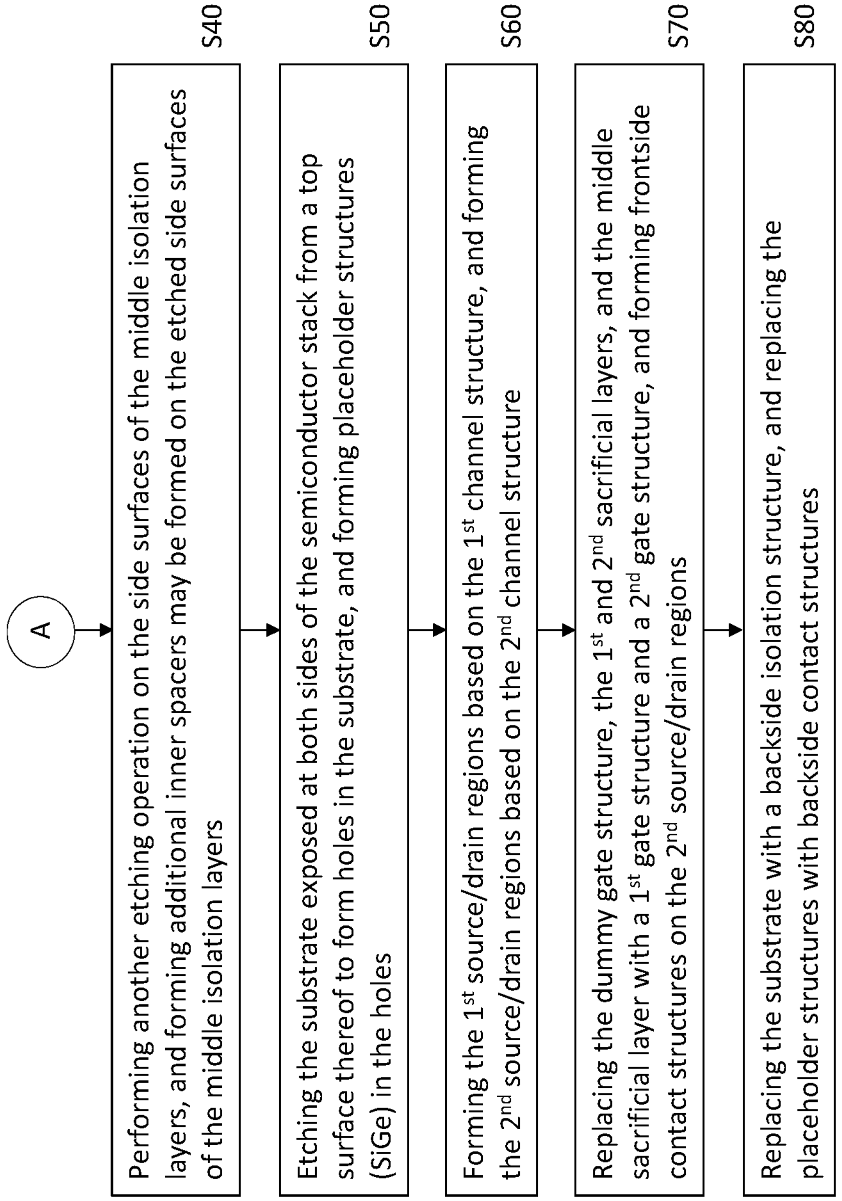

FIGS. 5A and 5B illustrate a flowchart of manufacturing a BSPDN-based 3D-stacked semiconductor device shown in FIGS. 3 to 4A-4N, according embodiments.

In step S10 (corresponding to FIGS. 4A-4B), a semiconductor stack may be formed by epitaxially growing a plurality of semiconductor layers on a substrate in the order of a bottom sacrificial layer, a 1$^{st}$ channel structure including 1$^{st}$ sacrificial layers and 1$^{st}$ channel layers, a middle isolation structure including a plurality of middle isolation layers and a middle sacrificial layer therebetween, and a 2$^{nd}$ channel structure including 2$^{nd}$ sacrificial layers and 2$^{nd}$ channel layers, and then a dummy gate structure may be formed on the semiconductor stack.

The bottom sacrificial layer, and the 1$^{st}$ sacrificial layers, the middle isolation layers, the middle sacrificial layer, and the 2$^{nd}$ sacrificial layers may all be formed of silicon germanium (SiGe) but with different Ge concentrations. For example, the bottom sacrificial layer may have Ge concentration of 40-45%, the 1$^{st}$ and 2$^{nd}$ sacrificial layers and the middle sacrificial layer may have Ge concentration of 25-30%, and the middle isolation layers may have Ge concentration of 10-15%. The channel layers may be formed of silicon, for example.

In step S20 (corresponding to FIG. 4C), the semiconductor layers are selectively etched from side surfaces thereof such that the bottom sacrificial layer is entirely removed, the 1$^{st}$ and 2$^{nd}$ sacrificial layers and the middle sacrificial layer are etched by a 1$^{st}$ length at the side surfaces thereof, and the middle isolation layers are etched by a 2$^{nd}$ length, smaller than the 1$^{st}$ length, at the side surfaces thereof.

The selective etching in this step may etch only a Ge or SiGe component without attaching the channel layers.

In step S30 (corresponding to FIG. 4D), a bottom isolation layer may be formed in a space obtained by entirely removing the bottom sacrificial layer, and inner spacers may be formed on recesses obtained by the selective etching on the side surfaces of the 1$^{st}$ and 2$^{nd}$ sacrificial layers, and the middle sacrificial layer.

In step S40 (corresponding to FIGS. 4E-4F), another etching operation may be performed on the side surfaces of the middle isolation layers and additional inner spacers may be formed on the etched side surfaces on the middle isolation layers.

In step S50 (corresponding to FIG. 4G), the substrate exposed at both sides of the semiconductor stack may be etched from a top surface thereof to form holes in the substrate, and placeholder structures for 1$^{st}$ source/drain regions may be formed in the holes. A material forming the placeholder structure may be, for example, silicon germanium (SiGe), not being limited thereto.

In step S60 (corresponding to FIGS. 4H-4J), the 1$^{st}$ source/drain regions may be formed based on the 1$^{st}$ channel structure, and the 2$^{nd}$ source/drain regions may be formed based on the 2$^{nd}$ channel structure thereafter.

The 1$^{st}$ source/drain regions may be epitaxially grown from the 1$^{st}$ channel layers while the 2$^{nd}$ channel structure is covered by one or more blocking layers so that no epitaxy may be performed from the 2$^{nd}$ channel structure including the 2$^{nd}$ channel layers. After the 1$^{st}$ source/drain regions are formed, a protection layer and an isolation structure may be formed on the 1$^{st}$ source/drain regions, and then, the 2$^{nd}$ source/drain regions may be epitaxially grown from the 2$^{nd}$ channel layers.

In step S70 (corresponding to FIGS. 4K-4M), the dummy gate structure, the 1$^{st}$ and 2$^{nd}$ sacrificial layers, and the middle sacrificial layer may be removed, and replaced by a 1$^{st}$ gate structure and a 2$^{nd}$ gate structure, followed by formation of frontside contact structures on the 2$^{nd}$ source/drain regions.

When the 1$^{st}$ and 2$^{nd}$ sacrificial layers and the middle sacrificial layer are removed by, for example, dry etching or wet etching using an etchant that selectively etches these sacrificial layers with a high Ge concentration, the middle isolation layers with a low Ge concentration along with the 1$^{st}$ and 2$^{nd}$ channel layers may not be attacked by this etching operation because of the difference in the Ge concentration.

The 1$^{st}$ gate structure may be formed to surround the 1$^{st}$ channel layers to control current flow between the 1$^{st}$ source/drain regions through the 1$^{st}$ channel layers, and the 2$^{nd}$ gate structure may be formed to surround the 2$^{nd}$ channel layers to control current flow between the 2$^{nd}$ source/drain regions though the 2$^{nd}$ channel layers. Thus, the middle isolation layers surviving the etching operation in this step may remain to isolate the 1$^{st}$ gate structure and the 2$^{nd}$ gate structure from each other.

Between the middle isolation layers, a portion of the 1$^{st}$ gate structure and/or the 2$^{nd}$ gate structure, or a dielectric material may be formed. The portion of the 1$^{st}$ gate structure and/or the 2$^{nd}$ gate structure may be not connected to the remaining portion of the 1$^{st}$ gate structure and/or the 2$^{nd}$ gate structure, and thus, may be non-functional or dummy.

In step S80 (corresponding to FIG. 4N), the substrate is removed and replaced by a backside isolation structure, and the placeholder structures may be removed and replaced by backside contact structures.

Figure 6:
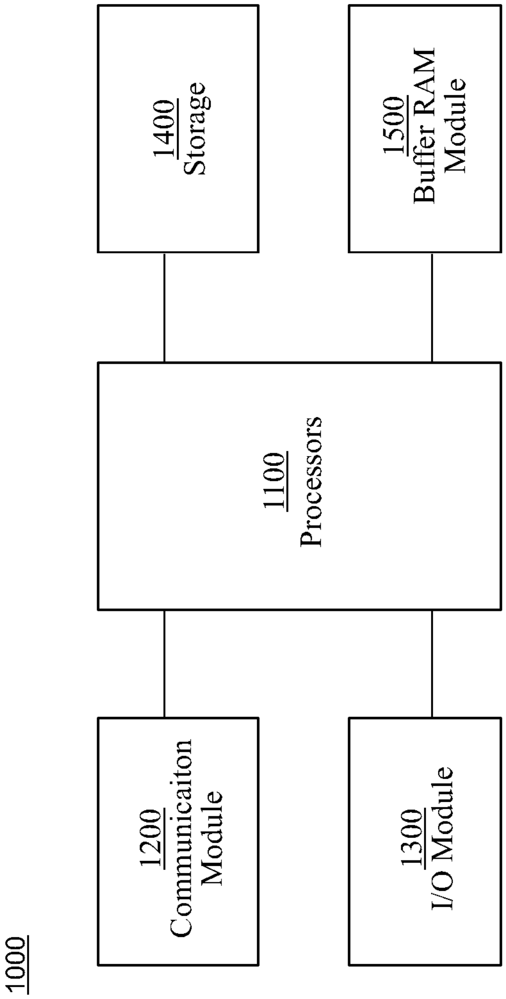
FIG. 6 is a schematic block diagram illustrating an electronic device including at least one of the 3D-stacked semiconductor devices shown in FIGS. 2 and 3, according to embodiments.

FIG. 6 is a schematic block diagram illustrating an electronic device including at least one of the 3D-stacked semiconductor devices shown in FIGS. 2 and 3, according to embodiments.

Referring to FIG. 6, an electronic device 1000 may include at least one processor 1100, a communication module 1200, an input/output module 1300, a storage 1400, and a buffer random access memory (RAM) module 1500. The electronic device 1000 may be a mobile device such as a smartphone or a tablet computer, not being limited thereto, according to embodiments.

The processor 1100 may include a central processing unit (CPU), a graphic processing unit (GPU) and/or any other processors that control operations of the electronic device 1000. The communication module 1200 may be implemented to perform wireless or wire communications with an external device. The input/output module 1300 may include at least one of a touch sensor, a touch panel a key board, a mouse, a proximate sensor, a microphone, etc. to receive an input, and at least one of a display, a speaker, etc. to generate an output signal processed by the processor 1100. The storage 1400 may be implemented to store user data input through the input/output module 1300, the output signal, etc. The storage 1400 may be an embedded multimedia card (eMMC), a solid state drive (SSD), a universal flash storage (UFS) device, etc.

The buffer RAM module 1500 may temporarily store data used for processing operations of the electronic device 1000. For example, the buffer RAM 1500 may include a volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 7, the electronic device 1000 may further include at least one sensor such as an image sensor.

At least one component in the electronic device 1000 may be formed based on at least one of the 3D-stacked semiconductor devices shown in FIGS. 3 and 4, according to embodiments.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A semiconductor device comprising:

a $1^{st}$ source/drain region connected to a $1^{st}$ channel structure which is controlled by a $1^{st}$ gate structure;

a $2^{nd}$ source/drain region, above the $1^{st}$ source/drain region, connected to a 2nd channel structure which is controlled by a $2^{nd}$ gate structure; and a middle isolation structure between the $1^{st}$ gate structure and the $2^{nd}$ gate structure, wherein the middle isolation structure comprises two or more semiconductor layers which are vertically stacked, wherein at least one of a portion of the $1^{st}$ gate structure and a portion of the $2^{nd}$ gate structure is disposed between the two or more semiconductor layers, and wherein the at least one of the portion of the $1^{st}$ gate structure and the portion of the $2^{nd}$ gate structure comprises a conductive material that is not electrically connected to a remaining portion of the $1^{st}$ gate structure or a remaining portion of the $2^{nd}$ gate structure.

2. The semiconductor device of claim 1, wherein the semiconductor layers comprise silicon germanium with Ge concentration of 10-15%.

3. The semiconductor device of claim 1, wherein a dielectric material is disposed between the stacked semiconductor layers.

4. The semiconductor device of claim 1, further comprising:

at least one inner spacer between the $1^{st}$ source/drain region and the $1^{st}$ gate structure, and between the $2^{nd}$ source/drain region and the $2^{nd}$ gate structure; and an additional inner spacer on a side surface of the middle isolation structure.

5. The semiconductor device of claim 4, wherein the at least one inner spacer and the additional inner spacer are connected to each other.

6. The semiconductor device of claim 1, further comprising a backside contact structure comprising a metal and connected to a bottom surface of the $1^{st}$ source/drain region.

7. The semiconductor device of claim 1, further comprising a bottom isolation layer below a bottom surface of the $1^{st}$ gate structure.

8. The semiconductor device of claim 7, wherein the at least one semiconductor layer comprises two or more SiGe layers with Ge concentration of 10-15% which are vertically stacked.

9. The semiconductor device of claim 8, wherein the at least one of the portion of the $1^{st}$ gate structure and the portion of the $2^{nd}$ gate structure is disposed between the SiGe layers.

10. A semiconductor device comprising:

$1^{st}$ source/drain regions connected to a $1^{st}$ channel structure surrounded by a $1^{st}$ gate structure;

$2^{nd}$ source/drain regions, respectively above the $1^{st}$ source/drain regions, connected to a $2^{nd}$ channel structure which is surrounded by a $2^{nd}$ gate structure; and a middle isolation structure between the $1^{st}$ gate structure and the $2^{nd}$ gate structure, wherein the middle isolation structure comprises at least one of a portion of the $1^{st}$ gate structure and a portion of the $2^{nd}$ gate structure, wherein the at least one of the portion of the $1^{st}$ gate structure and the portion of the $2^{nd}$ gate structure comprises a conductive material that is not electrically connected to a remaining portion of the $1^{st}$ gate structure or a remaining portion of the $2^{nd}$ gate structure, and wherein the middle isolation structure comprises at least one semiconductor layer comprising silicon germanium (SiGe) with Ge concentration of 10-15%.

11. The semiconductor device of claim 10, further comprising:

at least one inner spacer between the $1^{st}$ source/drain region and the $1^{st}$ gate structure, and between the $2^{nd}$ source/drain region and the $2^{nd}$ gate structure; and an additional inner spacer on a side surface of the middle isolation structure.

12. The semiconductor device of claim 11, wherein the at least one inner spacer and the additional inner spacer are connected to each other.

13. The semiconductor device of claim 10, further comprising a backside contact structure comprising a metal and connected to a bottom surface of the $1^{st}$ source/drain region.

14. The semiconductor device of claim 10, further comprising a bottom isolation layer below a bottom surface of the $1^{st}$ gate structure.

15. A semiconductor device comprising:

a $1^{st}$ source/drain region connected to a $1^{st}$ channel structure surrounded by a $1^{st}$ gate structure;

a $2^{nd}$ source/drain region, above the $1^{st}$ source/drain region, connected to a $2^{nd}$ channel structure which is surrounded by a $2^{nd}$ gate structure; and a middle isolation structure between the $1^{st}$ gate structure and the $2^{nd}$ gate structure, wherein the middle isolation structure comprises at least one of a portion of the $1^{st}$ gate structure and a portion of the $2^{nd}$ gate structure, and wherein the at least one of the portion of the $1^{st}$ gate structure and the portion of the $2^{nd}$ gate structure comprises a conductive material that is not electrically connected to a remaining portion of the $1^{st}$ gate structure or a remaining portion of the $2^{nd}$ gate structure.

16. The semiconductor device of claim 15, wherein the middle isolation structure further comprises two or more semiconductor layers which are vertically stacked, and wherein the at least one of the portion of the $1^{st}$ gate structure and the portion of the $2^{nd}$ gate structure is disposed between the two or more semiconductor layers.

17. The semiconductor device of claim 16, wherein the two or more semiconductor layers comprise silicon germanium (SiGe) with Ge concentration of 10-15%.

18. The semiconductor device of claim 15, further comprising:

at least one inner spacer between the $1^{st}$ source/drain region and the $1^{st}$ gate structure, and between the $2^{nd}$ source/drain region and the $2^{nd}$ gate structure; and an additional inner spacer on a side surface of the middle isolation structure, wherein the additional inner spacer is narrower than the at least one inner spacer.

19. The semiconductor device of claim 18, wherein the at least one inner spacer and the additional inner spacer are connected to each other.

20. The semiconductor device of claim 15 further comprising a backside contact structure comprising a metal and connected to a bottom surface of the $1^{st}$ source/drain region.

* * * * *